United States Patent [19]
Aono

[11] Patent Number: 5,751,023
[45] Date of Patent: May 12, 1998

[54] SEMICONDUCTOR DEVICE AND METHOD OF MANUFACTURING THE SAME

[75] Inventor: Shinji Aono, Hyogo, Japan

[73] Assignee: Mitsubishi Denki Kabushiki Kaisha, Tokyo, Japan

[21] Appl. No.: 745,643

[22] Filed: Nov. 8, 1996

[30] Foreign Application Priority Data

May 16, 1996 [JP] Japan .................. 8-121652

[51] Int. Cl.⁶ .................................................. H01L 29/74
[52] U.S. Cl. .................................................. 257/138; 257/172
[58] Field of Search ............................ 257/133, 155, 257/172, 655

[56] References Cited

U.S. PATENT DOCUMENTS 5,569,941  10/1996  Takahashi .

FOREIGN PATENT DOCUMENTS

| 1-91475 | 4/1989 | Japan . |
|---|---|---|
| 4-30476 | 2/1992 | Japan . |
| 5-48111 | 2/1993 | Japan . |
| 6-204481 | 7/1994 | Japan . |
| 6-236990 | 8/1994 | Japan . |
| 6-326317 | 11/1994 | Japan . |

*Primary Examiner*—Mark V. Prenty
*Attorney, Agent, or Firm*—McDermott, Will & Emery

[57] ABSTRACT

In a semiconductor device and a method of manufacturing the same, the semiconductor device is provided with an $n^+$-type layer located between an n-type buffer layer and a p-type collector layer and having a higher impurity concentration than n-type buffer layer. A diffusion depth of p-type collector layer toward a first main surface is smaller in a first region and is larger in a second region. As a result, the semiconductor device has a sufficiently reduced turn-off loss.

1 Claim, 39 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same. More particularly, the invention relates to a semiconductor device having a high breakdown voltage for use in a high-voltage inverter or the like as well as a method of manufacturing the same.

2. Description of the Background Art

Semiconductor elements having a high breakdown voltage for use in high-voltage inverters or the like have recently been demanded to have a higher operation speed and a lower on-voltage. In a field of a class of thousands of volts, GTO (Gate Turn-Off) thyristor elements have been largely used. However, it has been recently studied to improve breakdown voltages of IGBTs (Insulated Gate Bipolar Transistors) which allow increase in speed of devices.

In contrast to MOS devices which are unipolar devices and hence operate such that a current uses only carriers, the IGBTs can reduce an on-current owing to the fact that holes are introduced from a p-type collector layer side and a conductivity modulation is caused in an $n^-$-type layer.

With an operation current in a turn-off state of the IGBT, a channel disappears and a turn-off process starts when a gate voltage decreases to or below a threshold voltage. When electrons are supplied no longer from a source region, carriers in the IGBT decreases in number, which causes depletion at a pn junction between the $n^-$-type layer and p-well (base). In this turn-off operation, holes, i.e., an excessively small number of carriers progressively disappear.

Thus, it is important to reduce an accumulation quantity of an excessively small number of carriers, or to reduce rapidly the number of holes, i.e., an excessively small number of carriers. In order to achieve this, a structure which can suppress introduction of holes has been used. In this structure, an on-voltage generally rises due to suppression of holes, so that attention must be given to a tradeoff relationship between the turn-off time and the on-voltage.

A short-circuit structure at a rear side (collector side) has been known as a kind of techniques for suppressing introduction of holes, i.e., an excessively small number of carriers and rapidly reducing them. An IGBT having this structure will be described below with reference to FIG. 41.

FIG. 41 is a schematic cross section showing a structure of a IGBT with a high breakdown voltage which has been studied. This IGBT with a high breakdown voltage includes an $n^-$-type layer 1 made of a silicon substrate or the like, and also includes an n-type buffer layer 2, a p-collector layer 4, a collector electrode 5 and a collector terminal 6, which are formed at or on a second main surface (lower side in the figure) of $n^-$-type layer 1.

At a first main surface (upper side in the figure) of $n^-$-type layer 1, there are arranged p-type wells 10c, $n^+$-type emitter regions 10a and 10b, and $p^+$-type impurity layers 9 as well as gate trenches, each of which is formed of a trench groove 7a, a gate insulating film 7b and a buried gate 7c.

Gate electrodes 7d are arranged at buried gates 7c, respectively, and are connected to a gate terminal 7g. Emitter electrodes 11 are arranged at emitter regions 10a and 10b and $p^+$-type impurity layers 9, and are connected to an emitter terminal 7e.

FIG. 42 shows a doping profile of impurity taken along line I-I' in FIG. 41, and FIG. 43 shows a doping profile of impurity taken along line J-J' in FIG. 41.

This IGBT generally employs lightly doped thick $n^-$-type layer 1 for improving a breakdown voltage, and is provided at its collector side with n-type buffer layer 2 and p-type collector layer 4 for forming a pin-structure and thereby reducing a loss.

For stabilizing a high-voltage operation, this IGBT also employs a so-called collector short structure, which includes a certain portion not provided with a p-type collector layer 4 for short-circuiting collector electrode 5 and n-type buffer layer 2 through an n-type semiconductor region 13.

This collector short structure suffers from a problem that a turn-off loss, i.e., a power loss at turn-off is large. At turn-off, electrons pass through n-type semiconductor region 13 to collector electrode 5, so that such a problem arises that a magnitude of voltage drop exceeds a junction potential between n-type buffer layer 2 and p-type collector layer 4.

More specifically, this collector short structure cannot sufficiently achieve a forward bias condition for the junction between p-type collector layer 4 and n-type buffer layer 2 until a sum of a voltage drop of a current flowing through a resistor R1 at n-type buffer region 13 and a voltage drop by a lateral current flowing through a lateral resistor R2 at n-type buffer layer 2 exceeds about 0.7 V.

Therefore, if resistances of resistors R1 and R2 are small, introduction of holes from p-type collector layer 4 into $n^{31}$-type layer 1 scarcely occurs, and the IGBT operates similarly to an MOSFET (Metal Oxide Semiconductor Field Effect Transistor) having a high on-resistance. Therefore, resistances of resistors R1 and R2 must be sufficiently large in order to obtain a low on-voltage as an IGBT even with a low current density of about 1 A/cm$^2$.

However, a relationship of R2>>R1 results from the structure including general p-type collector layer 4 and n-type buffer layer 2. In order to achieve a practically acceptable value of resistor R2, a distance L1 between n-type semiconductor regions 13 must be remarkably increased to hundreds of micrometers, as shown in FIG. 41.

If the IGBT of a trench type shown in FIG. 41 has this distance L1, a cell size (L2) becomes significantly larger than a conventional value of about 5.0 μm. As a result, a larger number of holes are introduced from p-type collector layer 4 into n-type buffer layer 2 at a cell of IGBT remote from n-type semiconductor region 13 in the IGBT element, and a smaller number of holes are introduced at a cell of IGBT near n-type semiconductor region 13. This results in such a problem that the respective IGBTs in a chip operate significantly ununiformly.

During the operation with a large current, the voltage drop between p-type collector layer 4 and n-type buffer layer 2 is clamped at about 0.8 V. Therefore, a current flowing through resistor R1 in n-type semiconductor region shown in FIG. 41 takes on a value of 0.8/R1, and therefore scarcely depends on a collector current density.

Therefore, when the collector current density is high, a ratio of a current flowing through n-type semiconductor region 13 to the collector current density is small, so that an effect by n-type semiconductor region 13 decreases, and therefore a large amount of holes are introduced into $n^-$-type layer 1, as is done in a structure not provided with n-type semiconductor region 13.

An inverter circuit to which IGBTs are applied generally uses a circuit shown in FIG. 44. In this structure shown in FIG. 44, fast diodes D1 and D2 are connected in antiparallel to main switches S1 and S2 formed of IGBTs, respectively, so that currents flowing through a dielectric load L are returned to power supplies P1 and P2. In this circuit, the IGBTs forming the main switches may be reversely biased due to forward voltage drop (including transitional drop) at the diodes caused by return or circulation to the diodes.

More specifically, when switch S1 in FIG. 44 is turned on, a current flows in the circuit as indicated by arrow of solid line. When switch S1 is then turned off, the current tends to continue its flow through dielectric load L as indicated by the arrow of solid line. As a result, a current tends to flow to a fast diode D2 as indicated by an arrow of dotted line, so that a reverse voltage is applied to the IGBT of switch S2.

Accordingly, when a reverse voltage is applied to the IGBT of the collector short structure shown in FIG. 41, a positive voltage is applied to emitter electrode 11, and a negative voltage is applied to collector electrode 5. Consequently, a junction between p-type well $10c$ and $n^-$-type layer 1 is forwardly biased, and holes are introduced from p-type well $10c$ into $n^-$-type layer 1.

When the voltage applied to the IGBT is inverted before the holes disappears due to recombination, this IGBT is undesirably turned on. As described above, introduction of unnecessary holes into $n^-$-type layer 1 causes malfunction of the IGBT.

Structures at the collector side for overcoming the problems of these collector short structures are disclosed in Japanese Patent Laying-Open Nos. 4-30476 (1992) and 6-326317 (1994).

FIG. 45 is a schematic cross section showing a structure at the collector side of the IGBT disclosed in the above references. This structure does not employ the collector short structure, and is provided with a collector region 203 of a mixed structure including $p^+$emitter islands 203a and p-type emitters 203b.

Even the structure shown in FIG. 45 suffers from the following problem.

Even in the structure shown in FIG. 45, a turn-off loss may be still large and may not be sufficiently suppressed, which should be improved.

According to the references described above, p-type collector region 203b has an extremely small diffusion depth of about 1.2 μm from the collector surface. Generally, the collector surface side is fixed, e.g., to a lead frame in an assembling step such as a die bonding step. Therefore, if the diffusion depth of p-type collector region 203b is small, an influence by various stresses is liable to appear near the collector surface, for example, in a step of fixing the lead frame.

If p-type collector region 203b is to be formed at an extremely small diffusion depth of 1.2 μm from the collector surface, a heat treatment after forming p-type collector region 203b must be taken into consideration. For example, after forming p-type collector region 203b, a heat treatment must be effected on an interior of $n^+$emitter region 5 so that the diffusion depth of p-type collector region 203b may not exceed 1.2 μm. As described above, a relationship with heat treatment conditions for forming the respective impurity regions in a wafer process must be disadvantageously taken into consideration for manufacturing.

SUMMARY OF THE INVENTION

Accordingly, an object of the invention is to provide a semiconductor device having a sufficiently small turn-off loss and a method of manufacturing the same.

Another object of the invention is to provide a semiconductor device, which does not require consideration of an influence by a heat treatment performed for forming respective impurity regions, as well as a method of manufacturing the same.

The invention provides a semiconductor device operable to flow a main current between first and second main surfaces of a semiconductor substrate of an intrinsic or first conductivity type, including a first semiconductor layer of the first conductivity type formed at a second main surface side and having an impurity concentration higher than that of the semiconductor substrate, a second semiconductor layer of the first conductivity type formed at a partial region of the first semiconductor layer and having an impurity concentration higher than that of the first semiconductor layer, and a third semiconductor layer of a second conductivity type opposite to the first conductivity type covering the first and second semiconductor layers.

Further, in order to suppress introduction of holes from the third semiconductor layer into the second semiconductor layer without suppressing introduction of holes from the third semiconductor layer into the first semiconductor layer, a diffusion depth of impurity diffused in the third semiconductor layer toward the first main surface is determined such that the diffusion depth at a first region opposed to the second semiconductor layer is smaller than that at a second region opposed to the first semiconductor layer.

A method of manufacturing a semiconductor device according to an aspect of the invention includes the following steps.

First, in the method of manufacturing the semiconductor device operable to flow a main current between first and second main surfaces of a semiconductor substrate of an intrinsic or first conductivity type, the step is performed to form a first semiconductor layer of the first conductivity type having an impurity concentration higher than that of the semiconductor substrate entirely on the second main surface.

Then, impurity of the first conductivity type is introduced only into a predetermined region of the first semiconductor layer to form a second semiconductor layer of the first conductivity type having an impurity concentration higher than that of the first semiconductor layer. Thereafter, impurity of a second conductivity type opposite to the first conductivity type is introduced into whole surfaces of the first and second semiconductor layers to form a third impurity layer of the second conductivity type having a diffusion depth of impurity diffused toward the first main surface, the diffusion depth at a region opposed to the second semiconductor layer being smaller than that at a region opposed to the first semiconductor layer.

A method of manufacturing a semiconductor device according to another aspect of the invention includes the following steps.

First, in the method of manufacturing the semiconductor device operable to flow a main current between first and second main surfaces of a semiconductor substrate of an intrinsic or first conductivity type, impurity of the first conductivity type is introduced entirely into the second main surface to form a first semiconductor layer of the first conductivity type having an impurity concentration higher than that of the semiconductor substrate.

Then, impurity of the first conductivity type is introduced only into a predetermined region of the first semiconductor layer to form a second semiconductor layer of the first conductivity type having an impurity concentration higher than that of the first semiconductor layer.

Thereafter, impurity of a second conductivity type opposite to the first conductivity type is introduced into whole surfaces of the first and second semiconductor layers. Then, impurity of the second conductivity type is introduced only into the first semiconductor layer and a heat treatment is performed to form a third impurity layer of the second conductivity type having a diffusion depth of impurity diffused toward the first main, the diffusion depth at a region opposed to the second semiconductor layer being smaller than that at a region opposed to the first semiconductor layer, and the impurity concentration at the region opposed to the second semiconductor layer being lower than that at the region opposed to the first semiconductor layer.

According to the semiconductor device and the method of manufacturing the same described above, the second semiconductor layer, which is of the same conductivity type as the first semiconductor layer and has a higher impurity concentration than the first semiconductor layer, is formed at the region between the first and third semiconductor layers.

Consequently, introduction of holes is not suppressed at a region where the third and first semiconductor layers are in contact with each other, and introduction of holes can be suppressed at a region having the second semiconductor layer interposed between the third and first semiconductor layers, so that the turn-off loss which is a power loss at turn-off can be reduced.

The conventional collector short structure requires an extremely large distance or spacing of hundreds of micrometers between the short portions in order to set the resistance of the region to a practically acceptable value, so that it suffers from such a problem that ununiformity arises in characteristics of semiconductor devices in a chip. In contrast to this, the structure of the invention can reduce a pitch of the third semiconductor layers to one-fifth of the distance or spacing between the conventional short portions, so that uniformity in characteristics of the semiconductor devices can be ensured in a single chip.

Further, the third semiconductor layer can be fabricated easily by a conventional technique, i.e., introduction of impurity, so that no problem arises at manufacturing steps.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

A semiconductor device and a method of manufacturing the same according to an embodiment 1 of the invention will be described below with reference to FIGS. 1 to 12.

Figure 1:
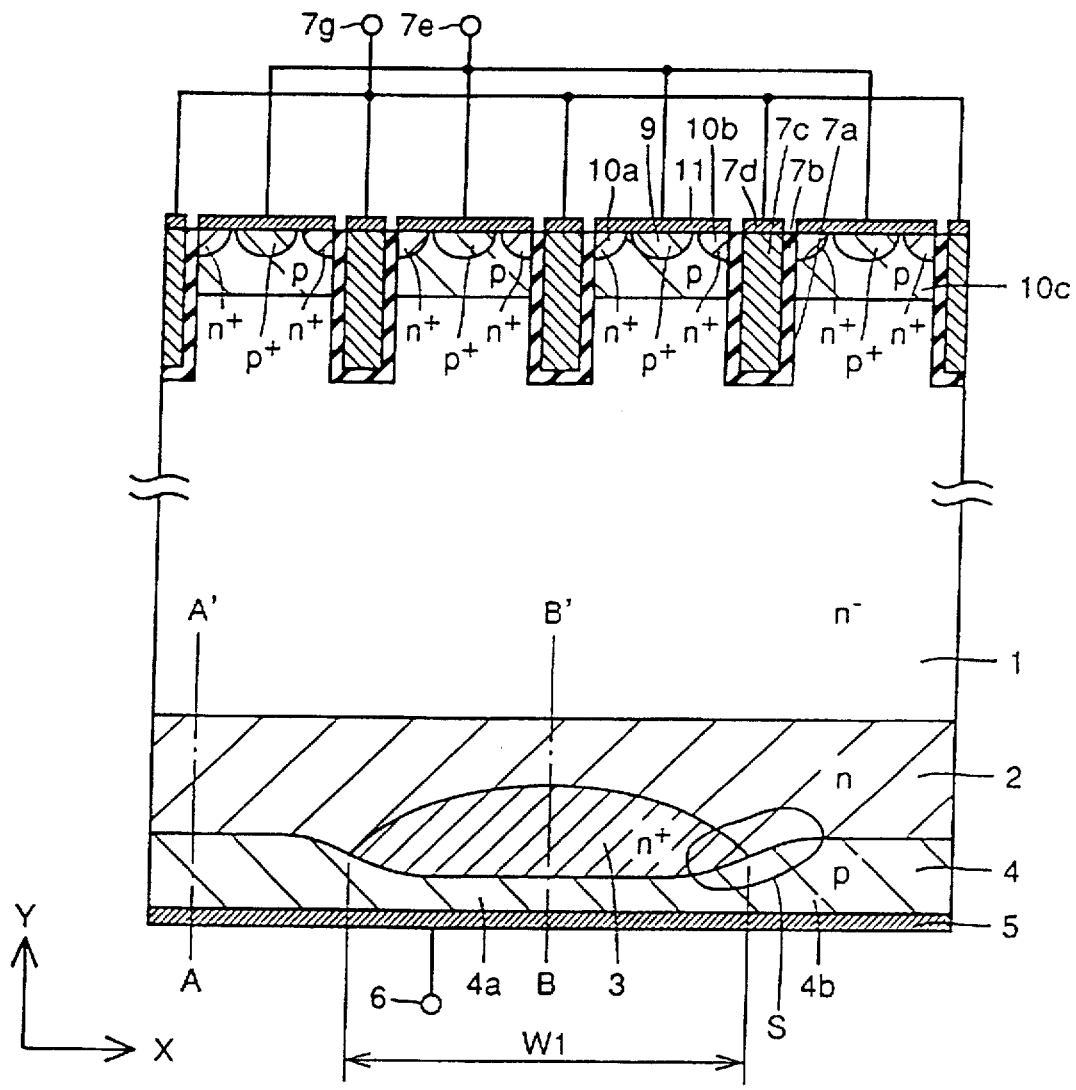
FIG. 1 is a cross section showing a structure of an IGBT according to an embodiment 1 of the invention.
Figure 41:
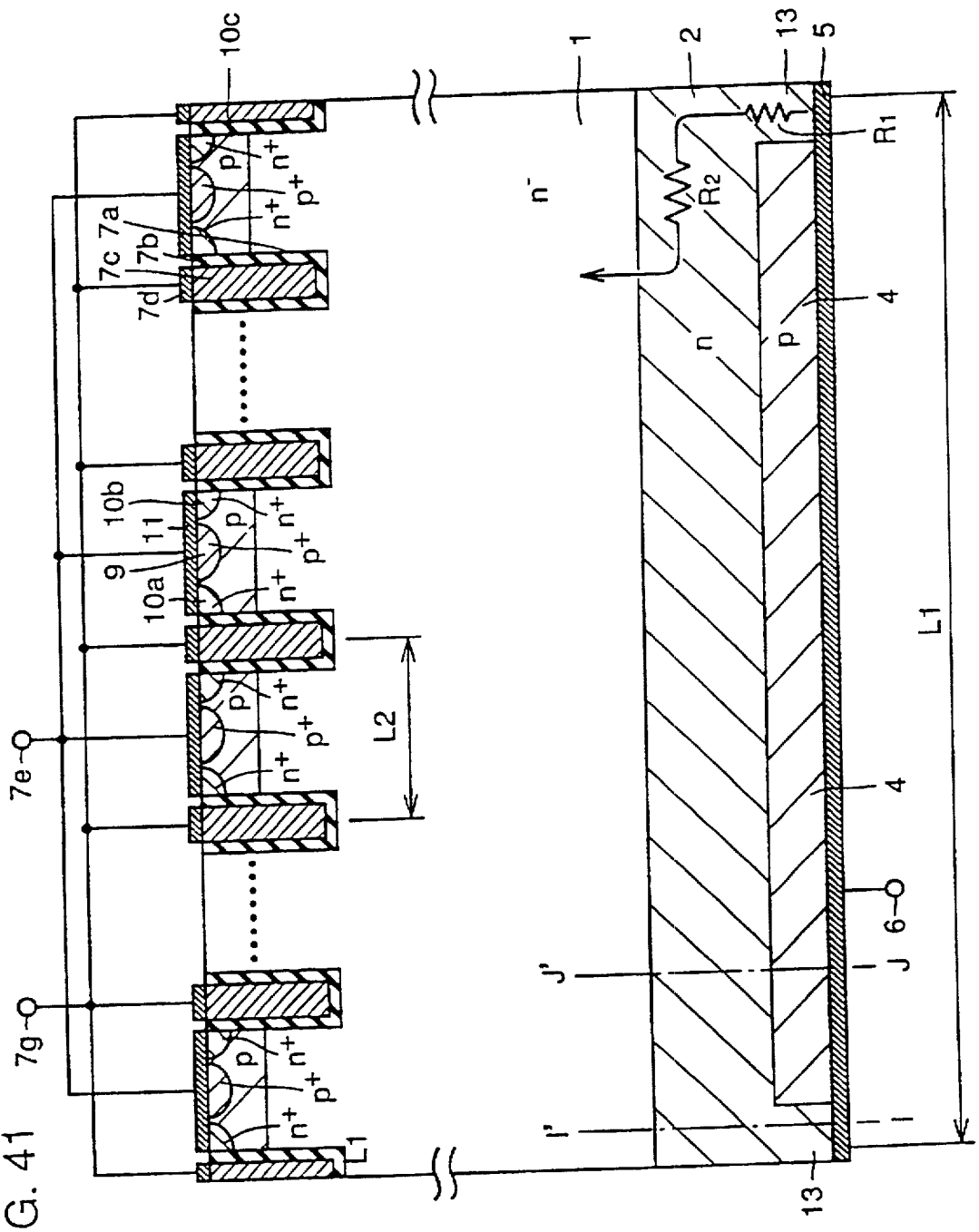
FIG. 41 is a cross section showing a structure of an IGBT in the prior art.
Figure 42:
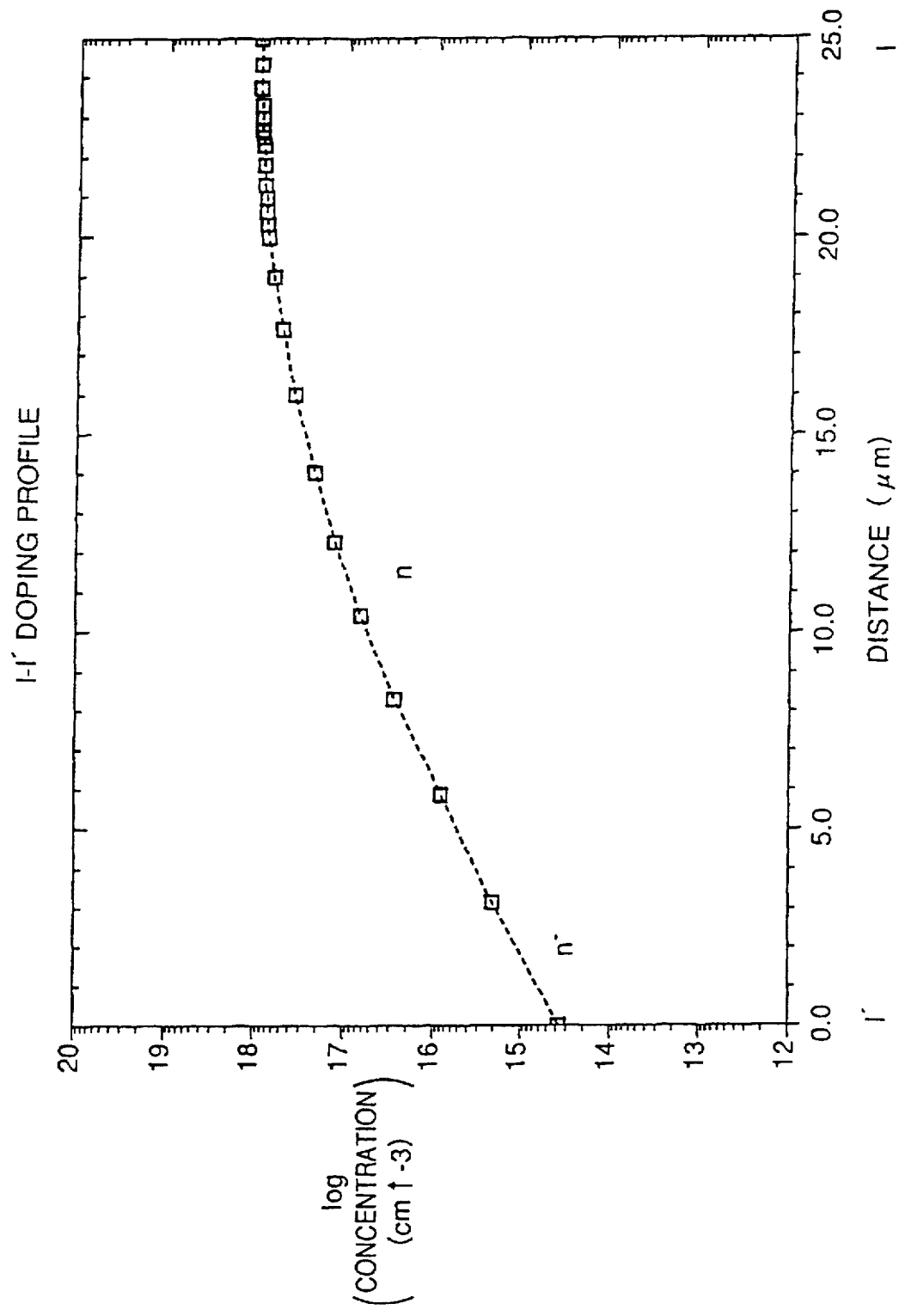
FIG. 42 shows a profile of impurity taken along line I'-I in FIG. 41.
Figure 43:
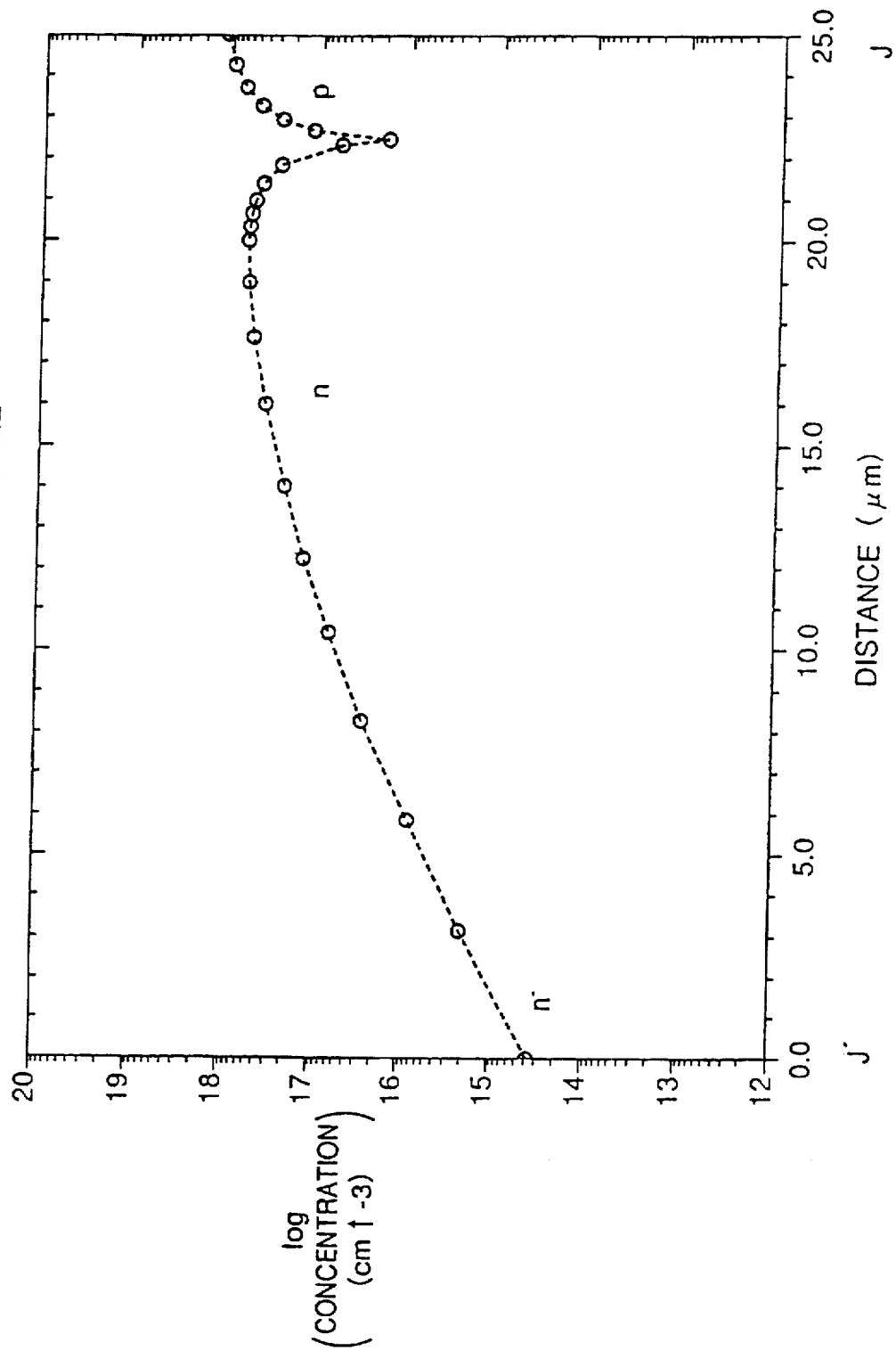
FIG. 43 shows a profile of impurity taken along line J'-J in FIG. 41.
Figure 44:
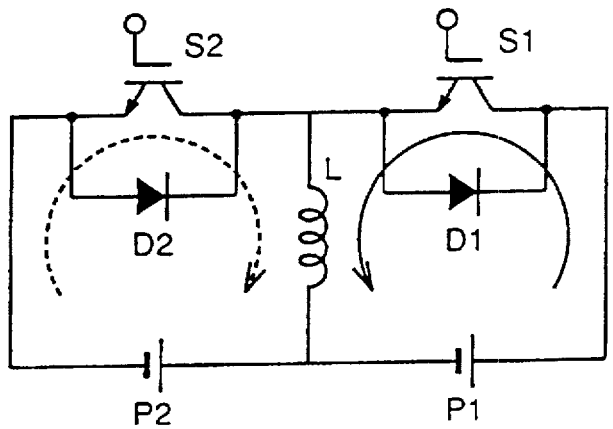
FIG. 44 shows a circuit structure for applying IGBTs to a general inverter.
Figure 45:
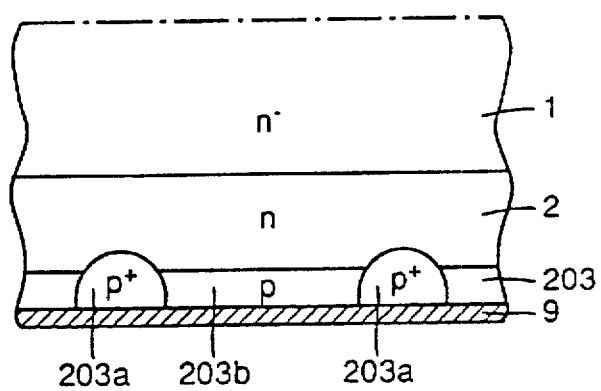
FIG. 45 is a schematic cross section showing a structure of a semiconductor device at an anode (collector) side disclosed in prior art references.

Referring first to FIG. 1, description will be given on a sectional structure of the semiconductor device of the embodiment 1. This semiconductor device has a structure similar to that of the IGBT in FIG. 41 already described as a prior art. Portions and parts having the same functions bear the same reference numbers, and therefore will not be specifically described below.

The structure of IGBT of the embodiment 1 has such a distinctive feature that an $n^+$-type layer 3 having an impurity concentration higher than that of n-type buffer layer 2 is formed at a region between n-type buffer layer 2 and p-type collector layer 4.

Figure 2:
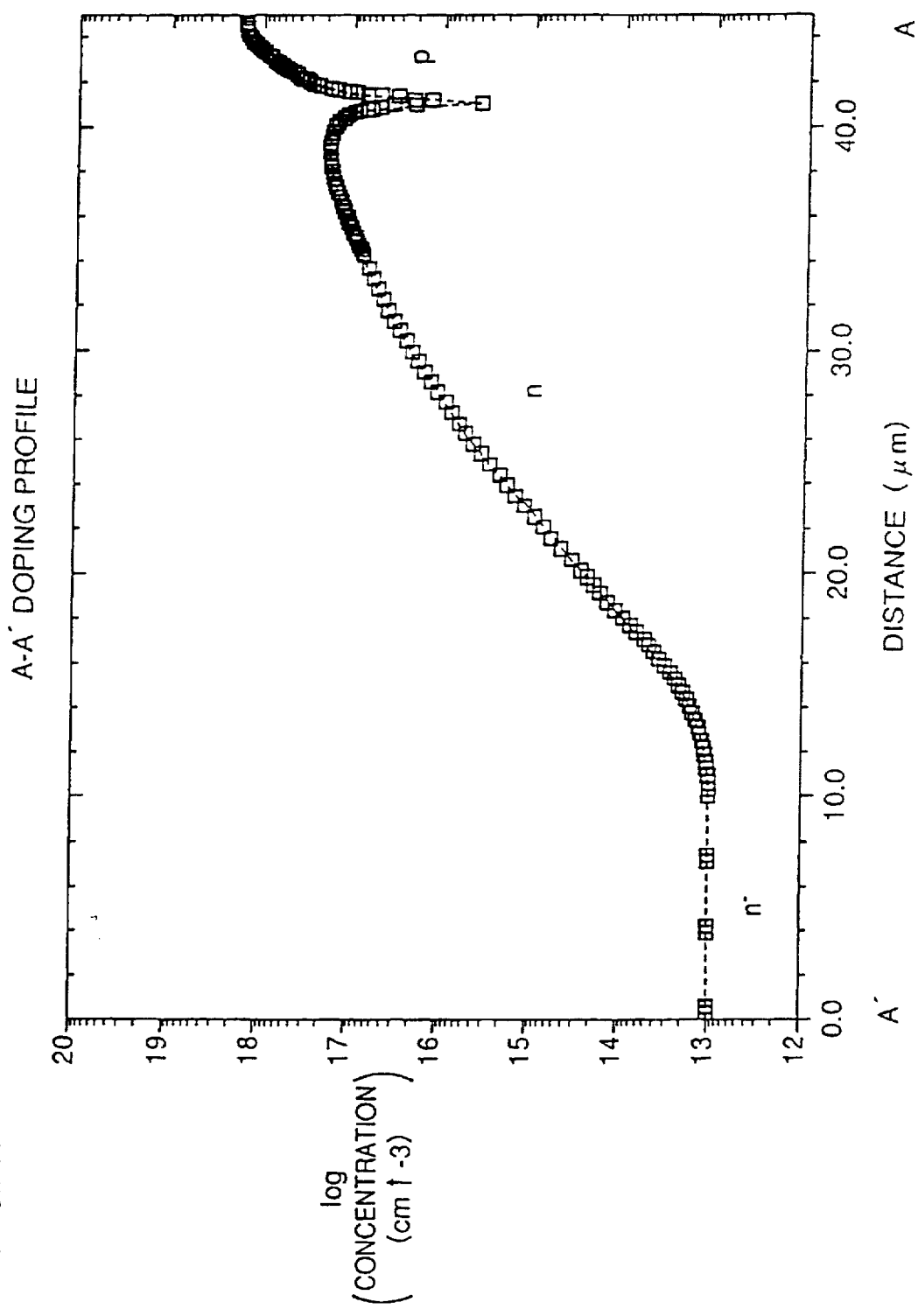
FIG. 2 shows a profile of impurity taken along line A'-A in FIG. 1.
Figure 3:
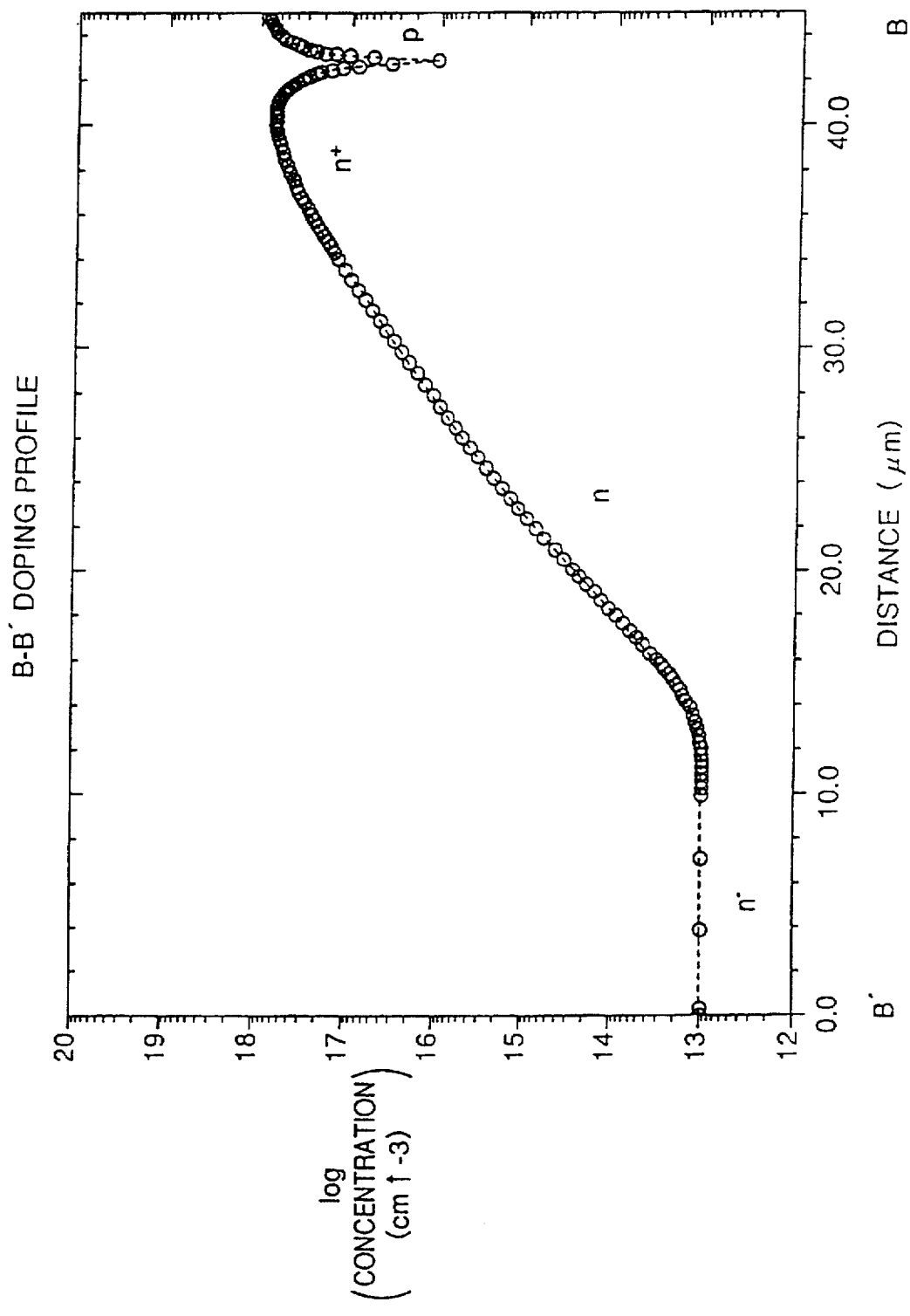
FIG. 3 shows a profile of impurity taken along line B'-B in FIG. 1.

A diffusion depth of impurity which is diffused in a first region 4a of p-type collector layer 4 provided with $n^+$-type layer 3 toward a first main surface is smaller than a diffusion depth of impurity which is diffused in a second region 4b of p-type collector layer 4 not provided with $n^+$-type layer 3 toward the first main surface. Impurity profiles taken along lines A'-A and B'-B in FIG. 1 are shown in FIGS. 2 and 3, respectively.

Referring to FIGS. 9 to 12, steps for manufacturing the IGBT of the embodiment 1 described above will be described below.

Figure 9:
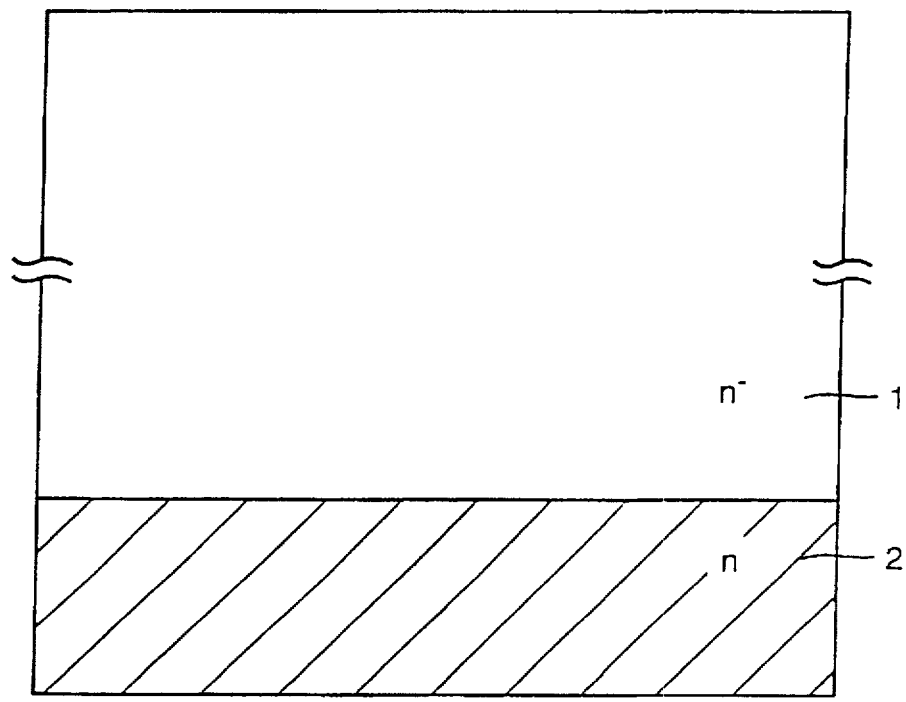
FIGS. 9 to 12 are cross sections showing 1st to 4th steps in a process of manufacturing the IGBT of the embodiment 1 of the invention, respectively.

Referring to FIG. 9, n-type impurity such as phosphorus ions having a large diffusion coefficient is implanted with a dose from $5 \times 10^{13}$ to $5 \times 10^{16}$ cm$^{-2}$ and an implantation energy of 100 keV or less into a second main surface of an n$^-$-type layer 1 which is made of an n$^-$ silicon substrate having an impurity concentration of $1 \times 10$ cm$^{-3}$ or less. Thereafter, a heat treatment is performed at a high temperature from 1200° C. to 1250° C. for 20 to 30 hours, so that n-type buffer layer 2 is formed.

n-type buffer layer 2 may be formed by another method such as a method using epitaxial growth and forming the layer 2 by ion implantation, or a method of forming a silicon crystal layer having a similar concentration of n-type impurity.

Figure 10:
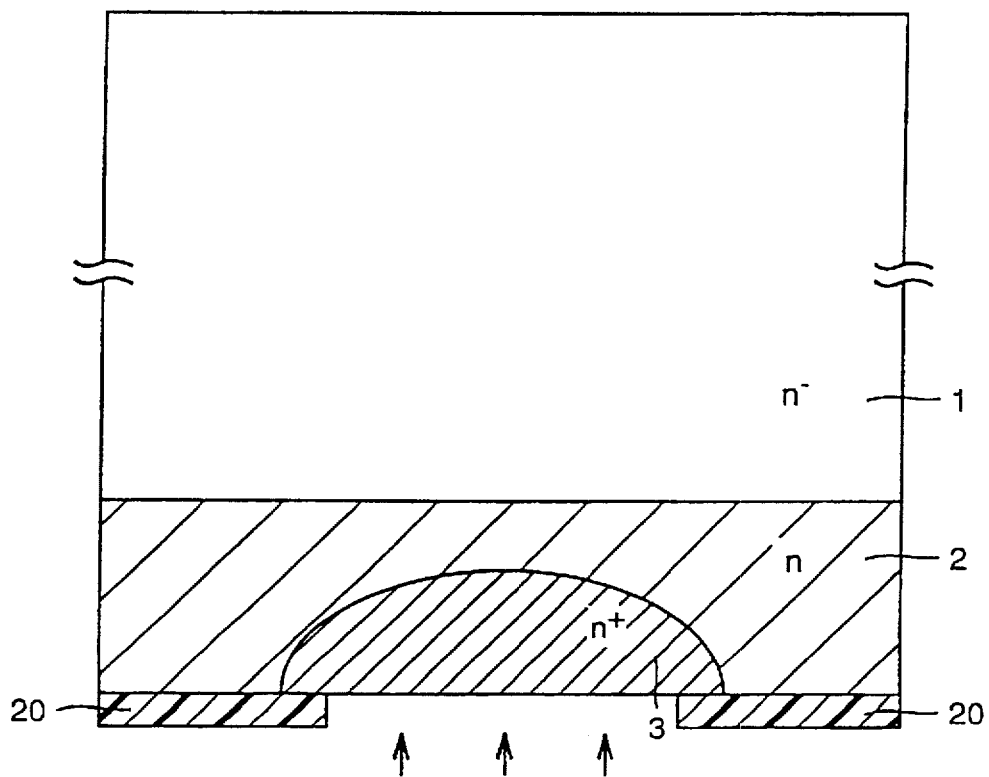
Figure 11:
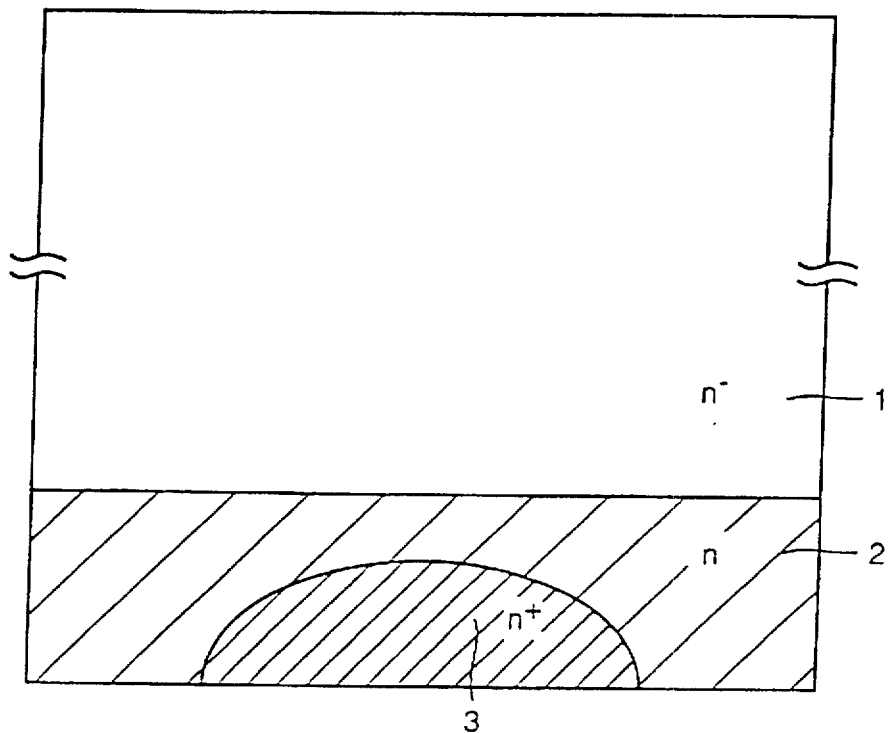

Referring to FIG. 10, a resist film 20 having a predetermined opening is formed at the second main surface by a photolithography technique. n-type impurity such as phosphorus ions having a large diffusion coefficient is implanted into n-type buffer layer 2 with a dose in a range from the dose for n-type buffer layer 2 to $5 \times 10^{16}$ cm$^{-2}$ and an implantation energy of 100 keV or less. Thereafter, a heat treatment is performed at a high temperature from 1200° C. to 1250° C. for 1 to 10 hours, so that n$^+$-type layer 3 is formed. Thereafter, resist film 20 is removed as shown in FIG. 11.

Figure 12:
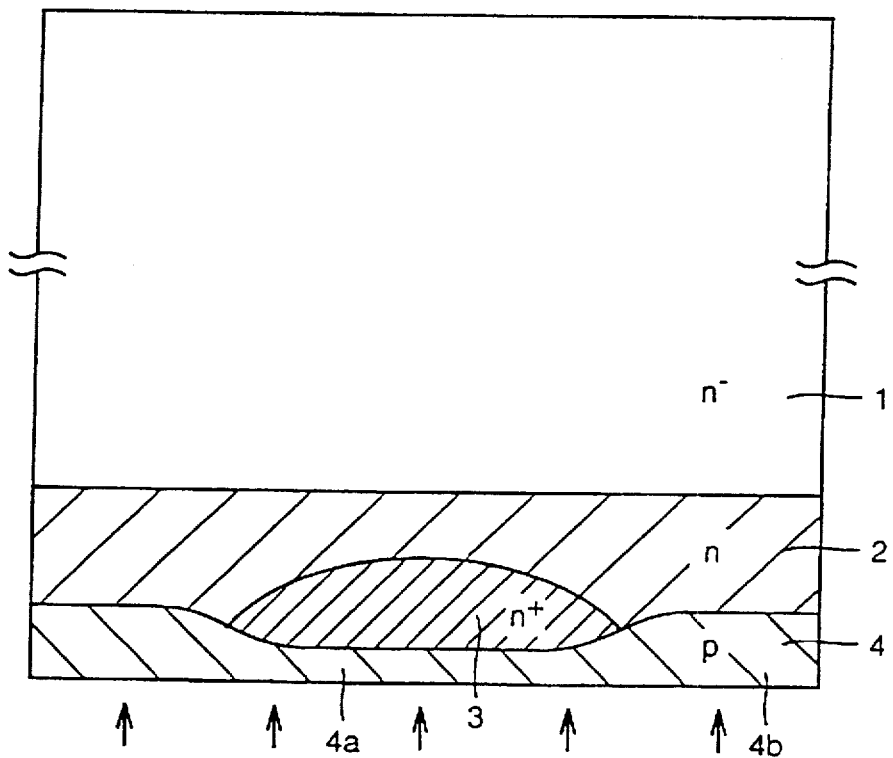

As shown in FIG. 12, p-type impurity such as boron or gallium is implanted into the whole second main surface with a dose in a range from the dose for n$^+$-type layer 3 to $5 \times 10$ cm$^{-2}$ and an implantation energy of 100 keV or less. Thereafter, a heat treatment is performed at a high temperature from 1100° C. to 1200° C. for one to five hours, so that p-type collector layer 4 is formed. By the heat treatments described above, n-type buffer layer 2, n$^+$-type layer 3 and p-type collector layer 4 having profiles shown in FIGS. 2 and 3 are formed.

Thereafter, steps using known techniques are performed to form a collector electrode 5 at the second main surface side as well as gate trenches and others at the first main surface side, so that the IGBT of the embodiment 1 shown in FIG. 1 is completed. In this manner, the structure of IGBT shown in FIG. 1 can be easily achieved using the impurity implanting technique.

Figure 4:
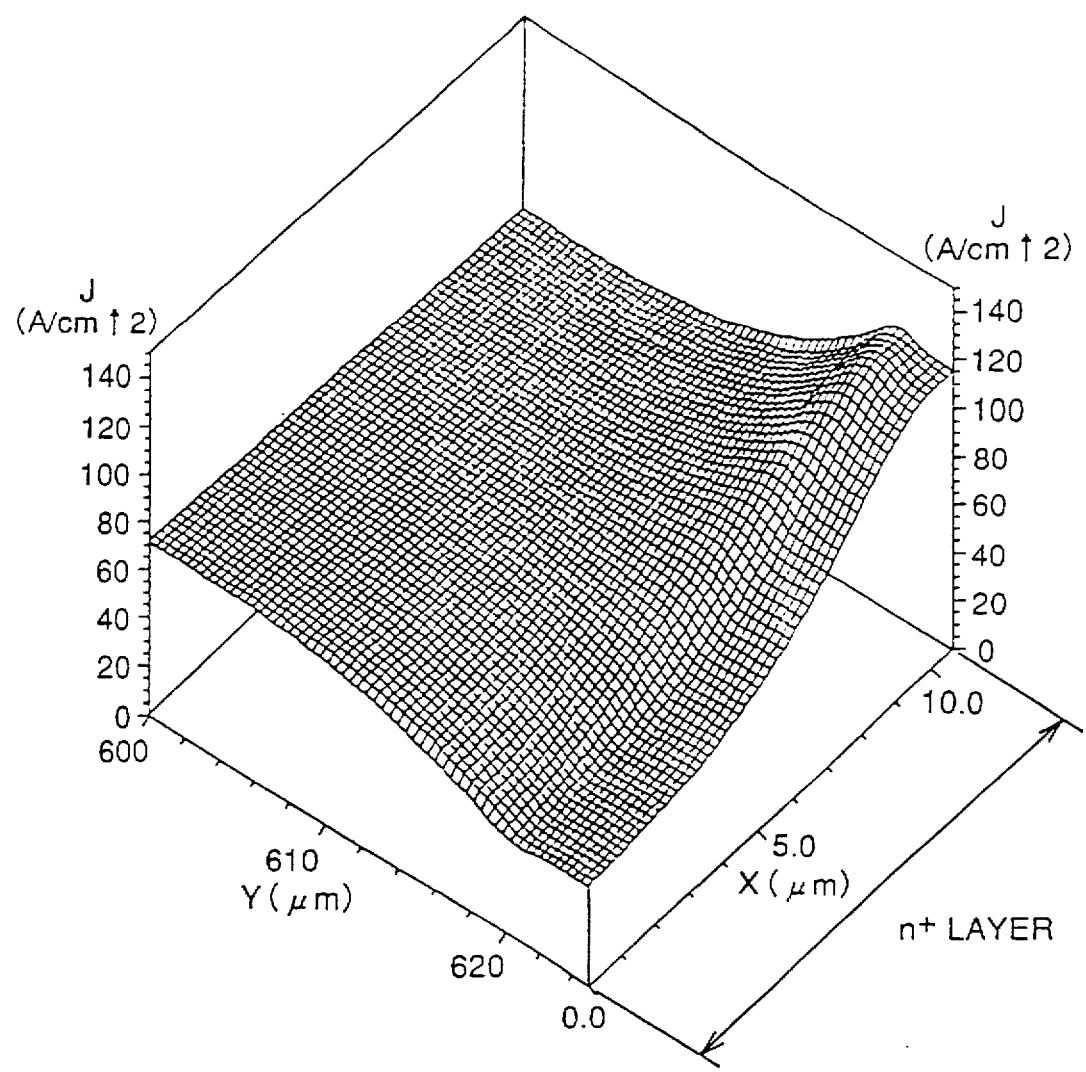
FIG. 4 shows an electron current distribution near a collector electrode.
Figure 5:
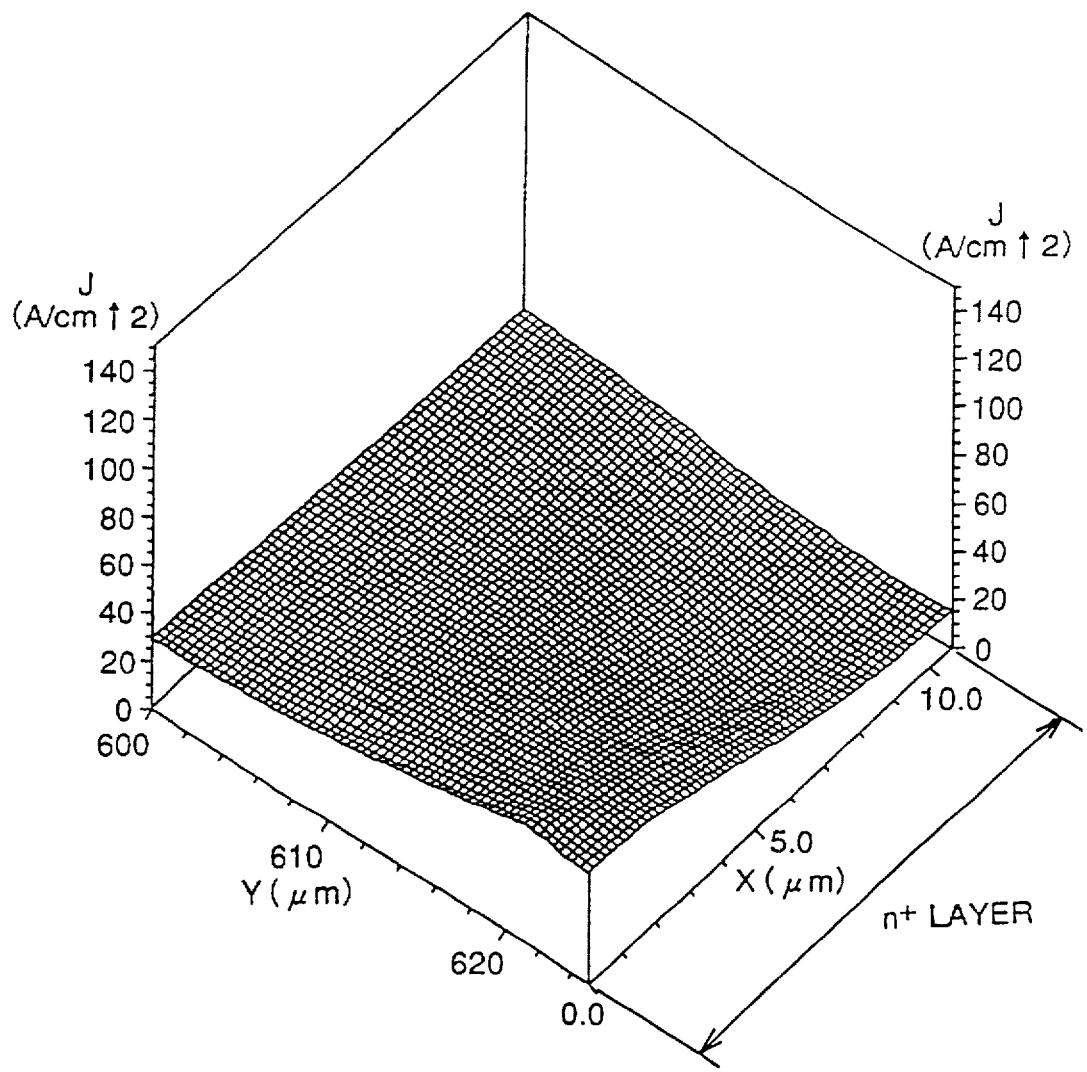
FIG. 5 shows a hole current distribution near a collector electrode.
Figure 6:
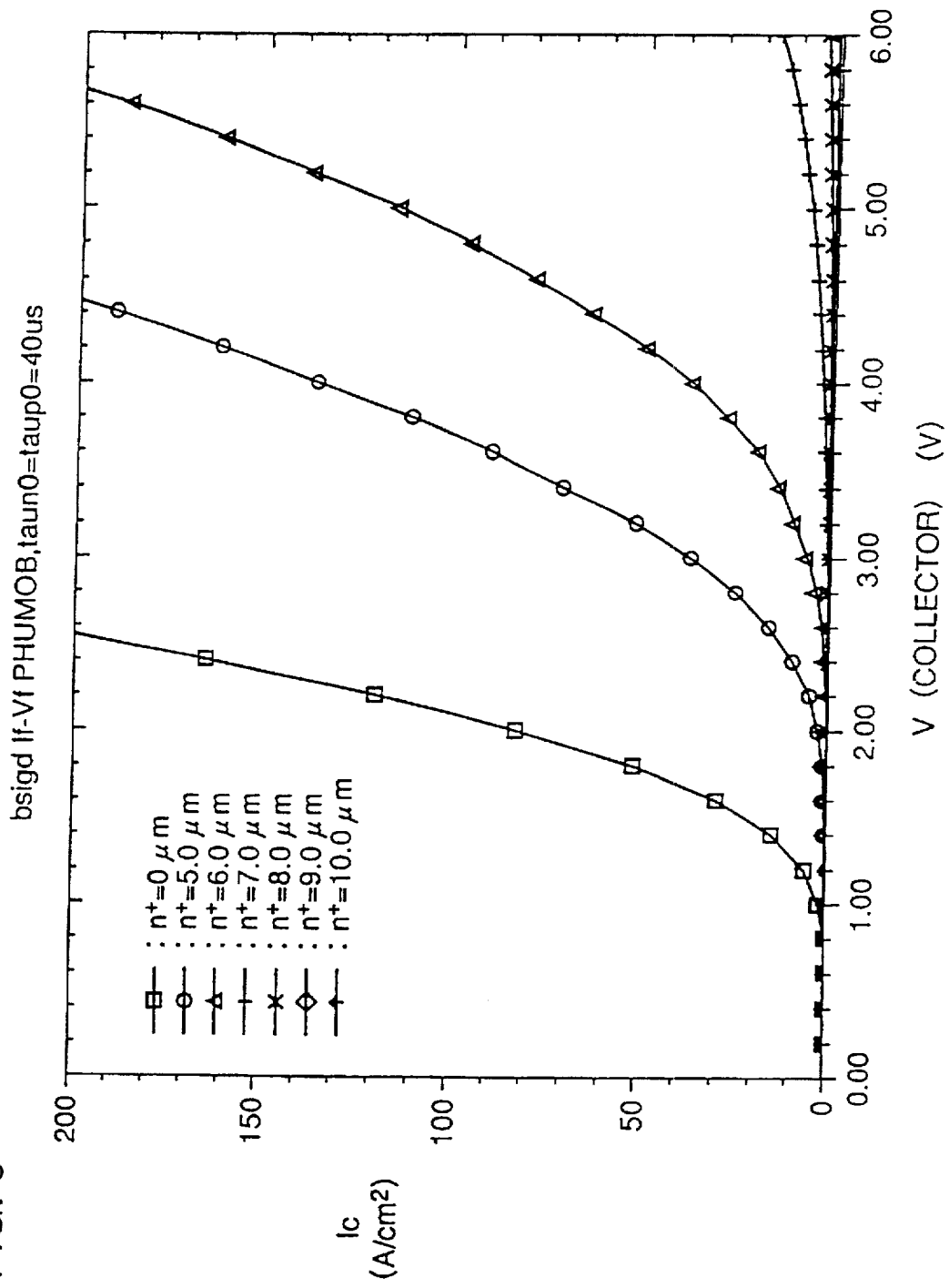
FIG. 6 shows a relationship between a collector voltage and a collector current.

Characteristics of the IGBT of the embodiment 1 will be described below. More specifically, description will be given on results of device simulation which was performed on sectional structure of the IGBT shown in FIG. 1. First, a current distribution near collector electrode 5 will be described below with reference to FIGS. 4 to 6. FIG. 4 is an electron current distribution near the collector electrode. FIG. 5 is a hole current distribution near the collector electrode. FIG. 6 shows a relationship between the collector voltage and the collector current.

In the IGBT shown in FIG. 1, the electron current density and the hole current density in the on-state are distributed at n-type buffer layer 2 and the vicinities of n$^+$-type layer 3 and p-type collector layer 4 with J=100 A/cm$^2$ and V ~3.7 V, as shown in FIGS. 4 and 5, respectively, when n$^+$-type layer 3 has a width (W$_1$) of 5.0 μm.

FIGS. 4 and 5 represent electron current density Je and hole current density Jh, respectively, on X representing a lateral dimension in FIG. 1 and Y representing a longitudinal dimension in FIG. 1.

In FIG. 4, the electron current density in n-type buffer layer 2 is about 70 A/cm$^2$, and makes up about 70% of the entire current density. This current increases to about 115 A/cm$^2$ at a region adjoining to n$^+$-type layer 3. Meanwhile, a current of only about 40 A/cm$^2$ flows through a region adjoining to n-type buffer layer 2.

Thus, electrons which exist in n-type buffer layer 2 and are large in amount flow through a junction surface between n$^+$-type layer 3 and p-type collector layer 4 to collector electrode 5. Only a small amount of holes flow through a junction surface between n-type buffer layer 2 and p-type collector layer 4.

Referring to FIG. 5, the following is found from the results described above. Flow of holes from p-type collector layer 4 into n-type buffer layer 2 takes place in exchange for compensation of flow of electrons into p-type collector layer 4 from the junction surface between n-type buffer layer 2 and p-type collector layer 4, so that the quantity of these holes decreases, and thus a dose of holes is restricted. It is also understood that the flow of holes is restricted at the section of B'-B in FIG. 1 to a higher extent than that at the section A'-A in FIG. 1.

Figure 7:
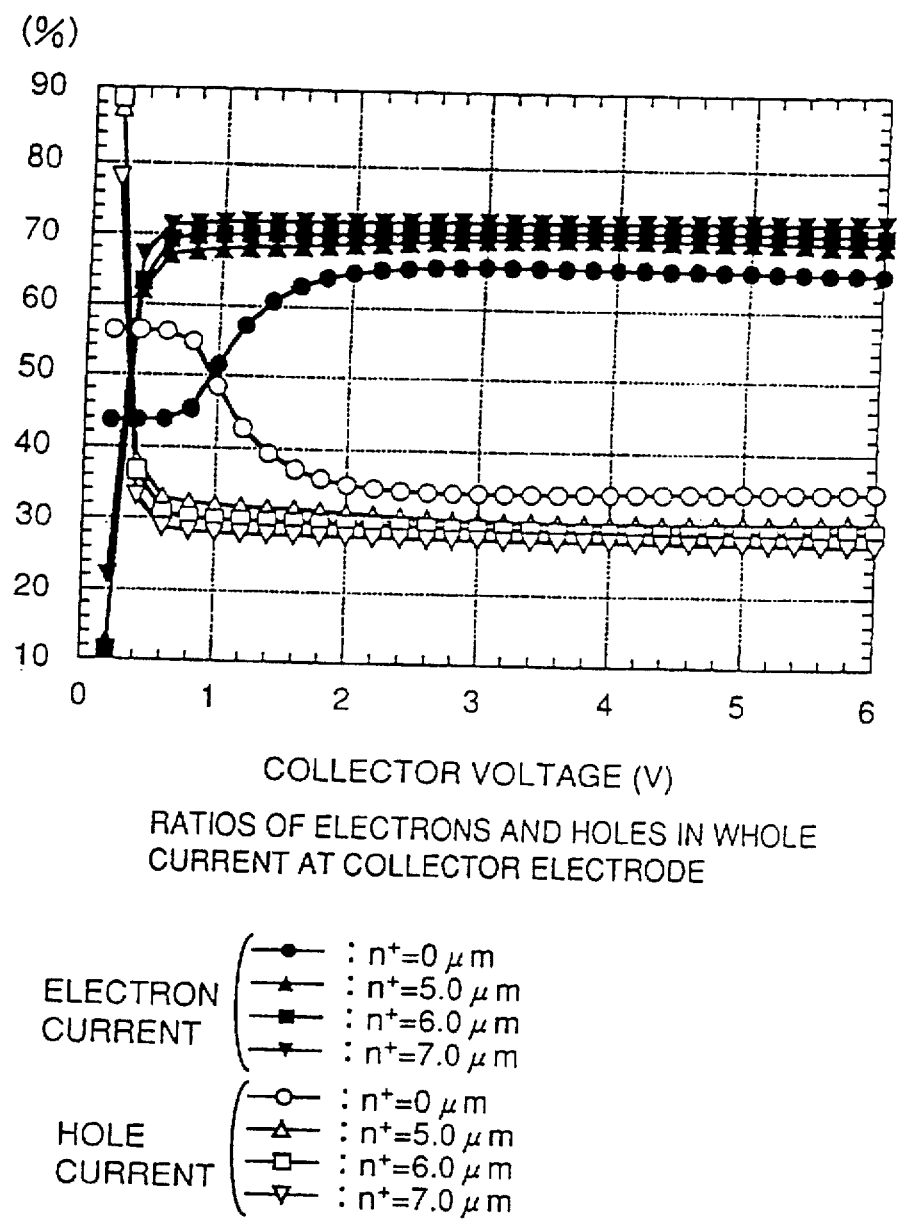
FIG. 7 shows ratios of electrons and holes at the collector electrode with respect to a whole current.
Figure 8:
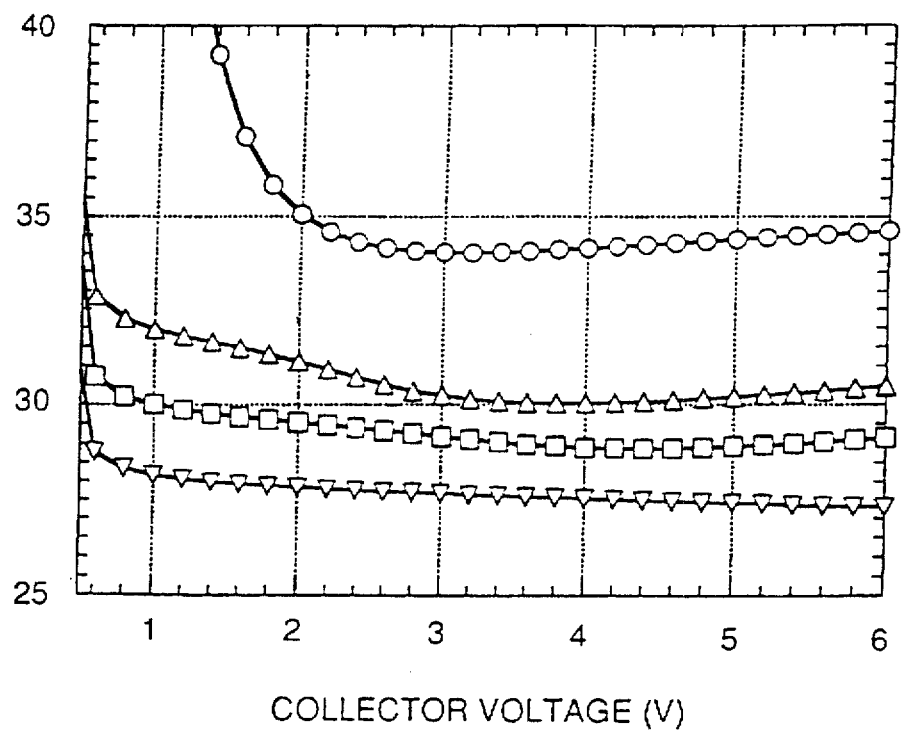
FIG. 8 shows ratios of holes at the collector electrode with respect to the whole current.

Referring to FIGS. 6 to 8, description will be given on results of device simulation which was performed to find current voltage characteristics on the sectional structure of the IGBT shown in FIG. 1.

Referring first to FIG. 6, description will be given on the case where n$^+$-type layer 3 has a width (W$_1$) of 0 μm.

Referring to FIG. 7 showing a ratio between the electron current and the hole current, the ratio of electron current is 66% and the hole current is 34% when the collector voltage is 2V or more. Referring to FIG. 6, therefore, it is understood that the collector current increases as the collector voltage increases. In FIGS. 7 and 8, it can be seen that the current ratio between electrons and holes at collector electrode 5 is substantially constant when the collector voltage is 2V or more.

Description will be given on the case where n$^+$-type layer 3 has a width (W$_1$) of 5.0 μm.

Referring to FIG. 7, the ratio between the electron current and the hole current is as follows. When the collector voltage is 1V or more, the electron current is in a range from 68% to 70%, and the hole current is in a range from 30% to 32%.

It can be seen from FIG. 6 that the collector current increases as the collector voltage increases. From FIGS. 7 and 8, it can be seen that the current ratio between electrons and holes in the collector current is substantially constant when the collector voltage is 1V or more.

It can also be seen that the current ratio of holes with W$_1$ of 0 μm is larger than that with W$_1$ of 5.0 μm.

Thus, it can be understood that a current ratio of holes in the whole current introduced from collector electrode 5 with W$_1$ of 5.0 μm is smaller than that with W$_1$ of 0 μm, and introduction of holes with W$_1$ of 5.0 μm is suppressed to a higher extent.

Description will be given on the case where n$^+$-type layer 3 has a width (W$_1$) of 6.0 μm.

Referring to FIG. 7, a ration between the electron current and the hole current is as follows. When the collector voltage is 1V or more, the ratio of electron current is in a range from 70% to 71%, and the ratio of hole current is in a range from 29% to 30%.

From FIG. 6, it is understood that the collector current increases as the collector voltage increases, and it is understood from FIGS. 7 and 8 that the current ratio between electrons and holes at collector electrode 5 is substantially constant when the collector voltage is 1V or more.

It is also understood that the current ratio of holes with $W_1$ of 5.0 μm is smaller than that with $W_1$ of 0 μm, and the current ratio of holes with $W_1$ of 6.0 μm is smaller than that with $W_1$ of 5.0 μm.

The current ratio of holes in the whole current introduced from collector electrode 5 decreases as $W_1$ changes from 0 μm through 5.0μ to 6.0 μm, and introduction of holes from the collector electrode is suppressed to a higher extent as $W_1$ changes in the above order.

Description will be given on the case where n⁺-type layer 3 has a width ($W_1$) of 7.0 μm.

Referring to FIG. 7, a ration between the electron current and the hole current is as follows. When the collector voltage is 1V or more, the ratio of electron current is in a range from 77% to 78%, and the ratio of hole current is in a range from 22% to 23%.

From FIG. 6, it is understood that the collector current does not increase significantly, even when the collector voltage increases to 6V.

From FIGS. 7 and 8, it is understood that the current ratio between electrons and holes at collector electrode 5 is substantially constant when the collector voltage is 1V or more.

In the IGBT of the embodiment 1, as discussed above, the ratio of holes introduced from the collector electrode with respect to the whole current depends on the structure at the collector side, and exhibits a substantially constant value in the on-state regardless of the density of the collector current.

A collector voltage value which sets the density of collector current to, e.g., 100 A/cm² is called an on-voltage, and the on-voltage value can be controlled by selecting a structure at the collector side.

The ratio of the hole current achieving the on-voltage decreases as $W_1$ increases from 0 μm through 5.0 μm to 6.0 μm, and it can be understood that the on-voltage value is controlled by suppressing introduction of holes.

In the embodiment 1, it is assumed that a ratio of a lateral diffusion depth of n⁺-type layer 3 to a longitudinal diffusion depth of the same is about 0.8. When the diffusion depth of n⁺-type layer 3 into n⁻-type layer 1 is 10 μm, the lateral diffusion depth or length is about 8 μm. It can be understood that introduction of holes can be controlled when the repetition pitch is about 20 μm or more.

Therefore, it is apparent that the embodiment 1 can reduce the repetition pitch of n⁺-type layers 3 to about one-fifth of the required repetition pitch of the short portions in the conventional short collector structure, which is about 100 μm.

Also, the following can be understood from the embodiment 1. In a device such as a trench gate IGBT having a short repetition pitch of bipolar elements at the first main surface side, the n⁺-type layers in this embodiment which can reduce the repetition pitch is preferable for uniformizing characteristics of semiconductor devices.

Embodiment 2

A semiconductor device and a method of manufacturing the same of the embodiment 2 of the invention will be described below with reference to FIGS. 13 to 20.

Figure 13:
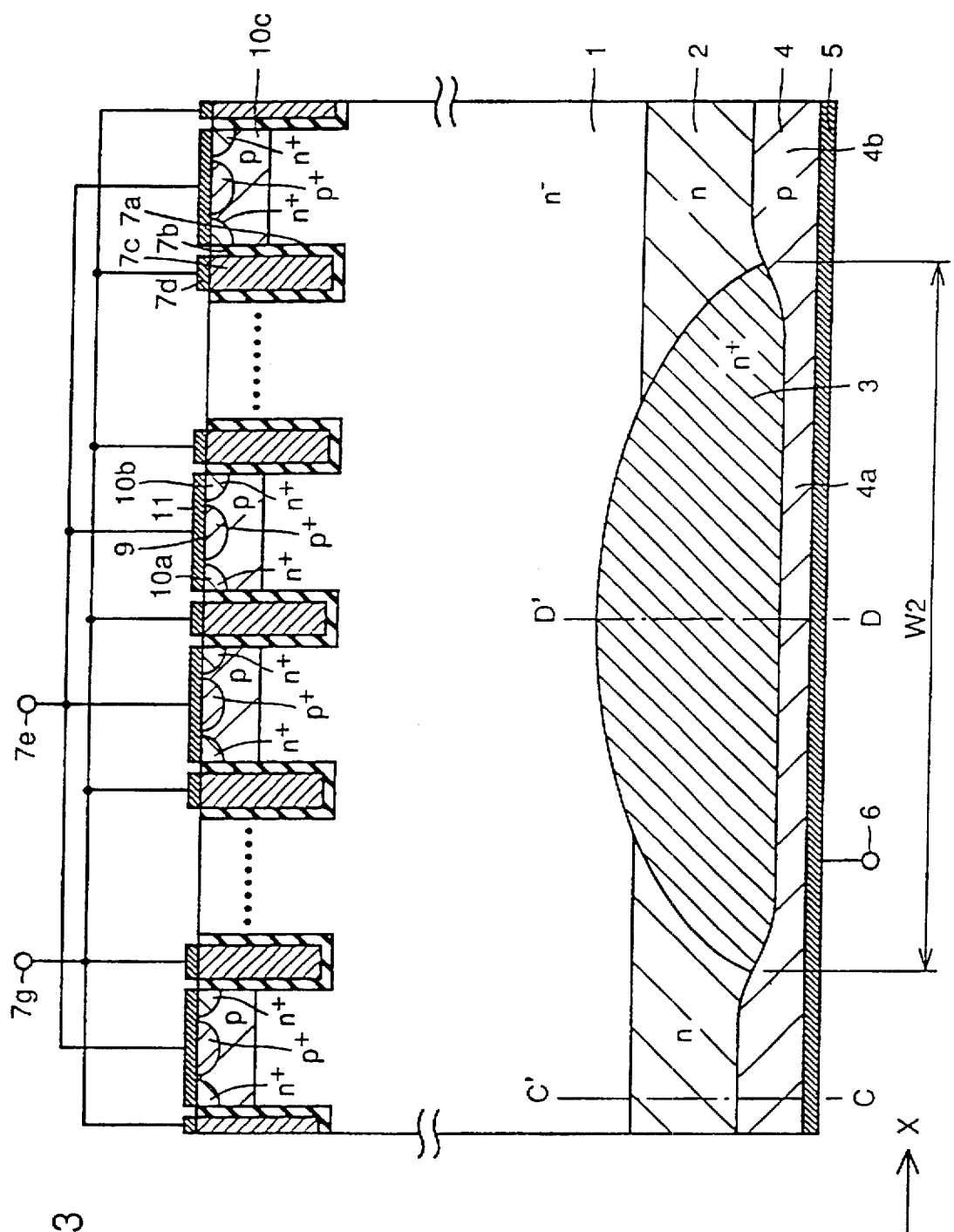
FIG. 13 is a cross section showing a structure of an IGBT according to an embodiment 2 of the invention.

Referring first to FIG. 13, a sectional structure of the semiconductor device of the embodiment 2 will be described below. This semiconductor device has a structure similar to that of the IGBT of the embodiment 1 already described. Portions and parts having the same function bear the same reference numbers.

Figure 14:
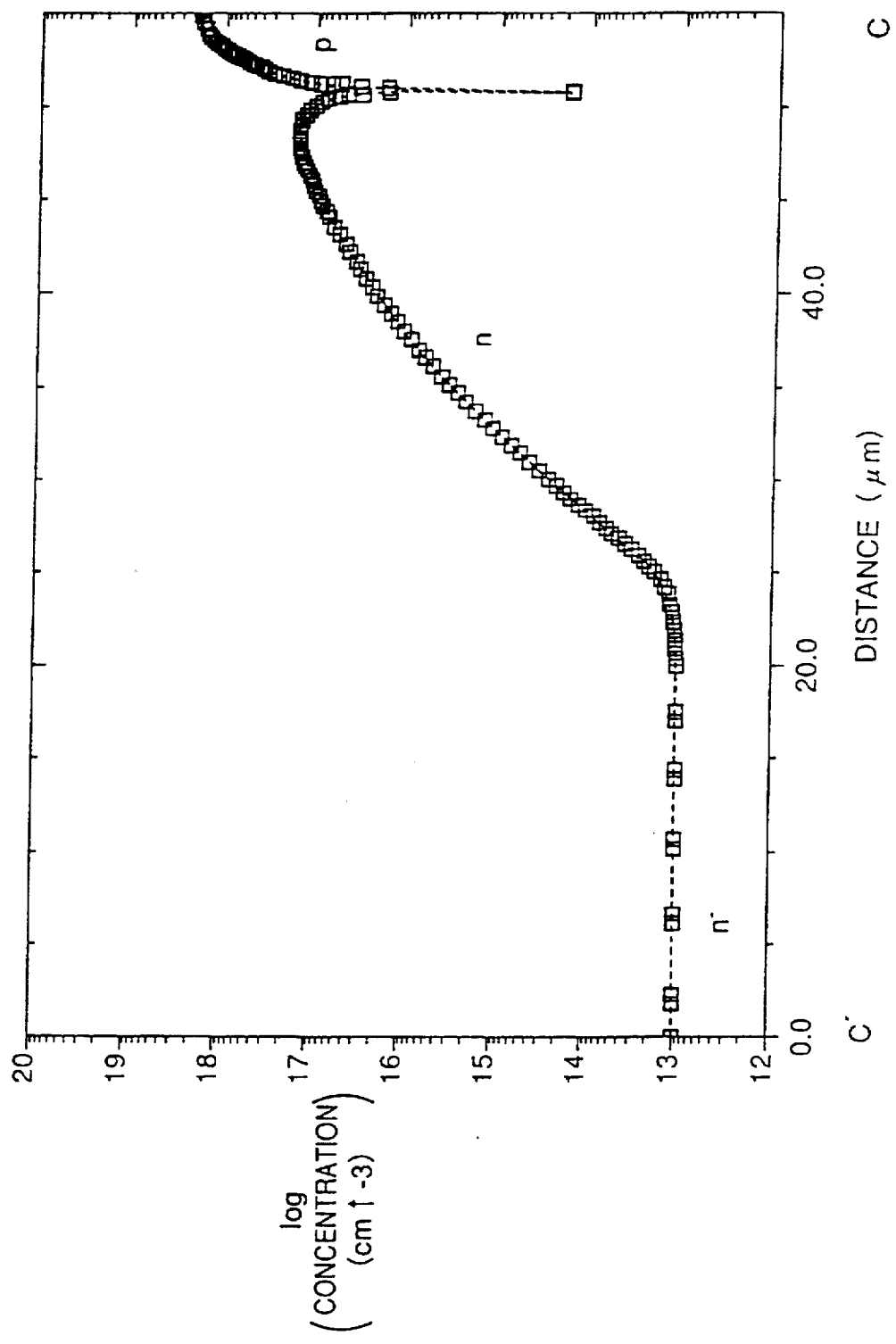
FIG. 14 shows a profile of impurity taken along line C'-C in FIG. 13.
Figure 15:
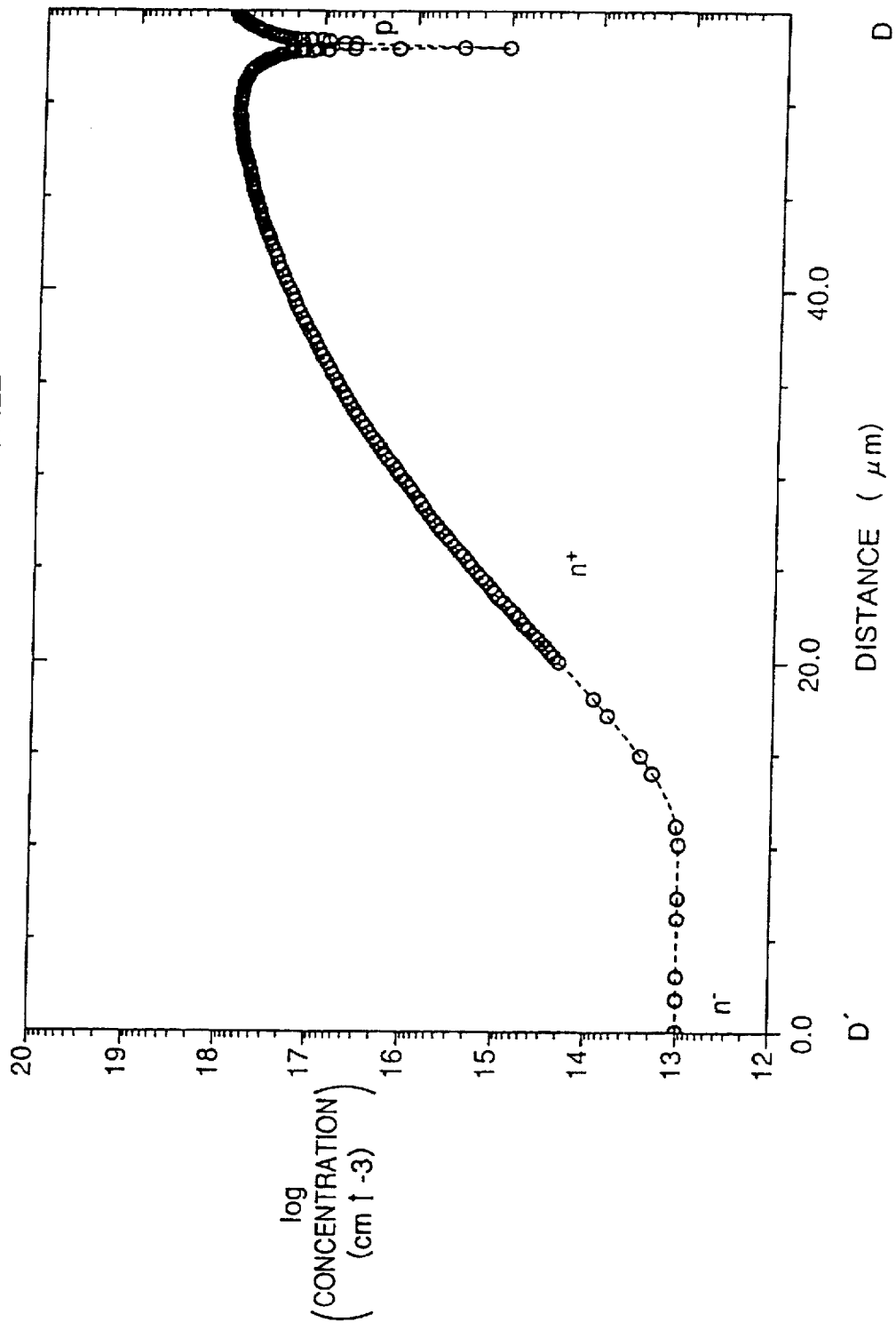
FIG. 15 shows a profile of impurity taken along line D'-D in FIG. 13.

The IGBT of the embodiment 2 differs from that of the embodiment 1 in that n⁺-type layer 3 is diffused not only into n-type buffer layer 2 but also into n⁻-type layer 1. Impurity profiles taken along lines C'-C and D'-D in FIG. 13 are shown in FIGS. 14 and 15, respectively.

Referring to FIGS. 16 to 20, a method of manufacturing the IGBT of the embodiment 2 will be described below.

Figure 16:
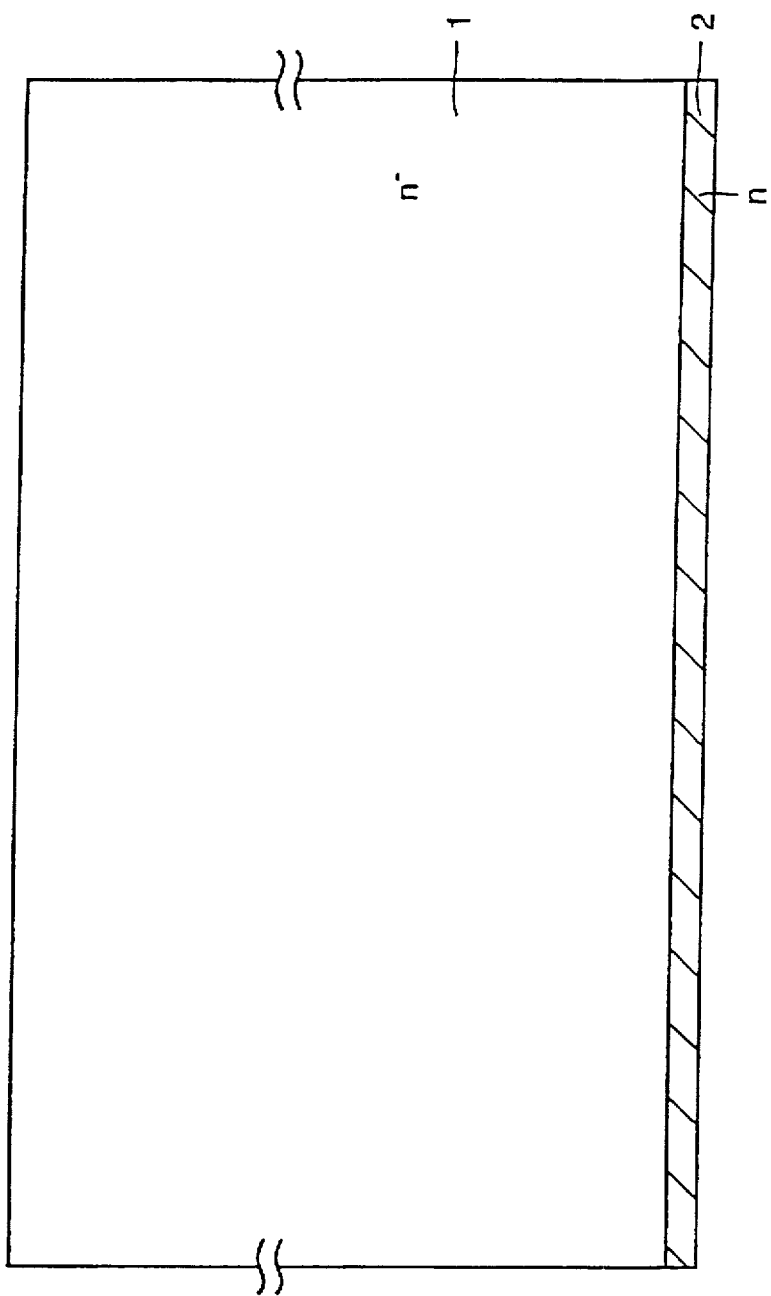
FIGS. 16 to 20 are cross sections showing 1st to 5th steps in a process of manufacturing the IGBT of the embodiment 2 of the invention, respectively.

Referring first to FIG. 16, n-type impurity such as phosphorus having a large diffusion coefficient is implanted with a dose from $5 \times 10^{13}$ to $5 \times 10^{16}$ cm⁻² and an implantation energy of 100 keV or less into the second main surface of n⁻-type layer 1 which is made of an n⁻ silicon substrate having an impurity concentration of $1 \times 10^{13}$ cm⁻³ or less.

Figure 17:
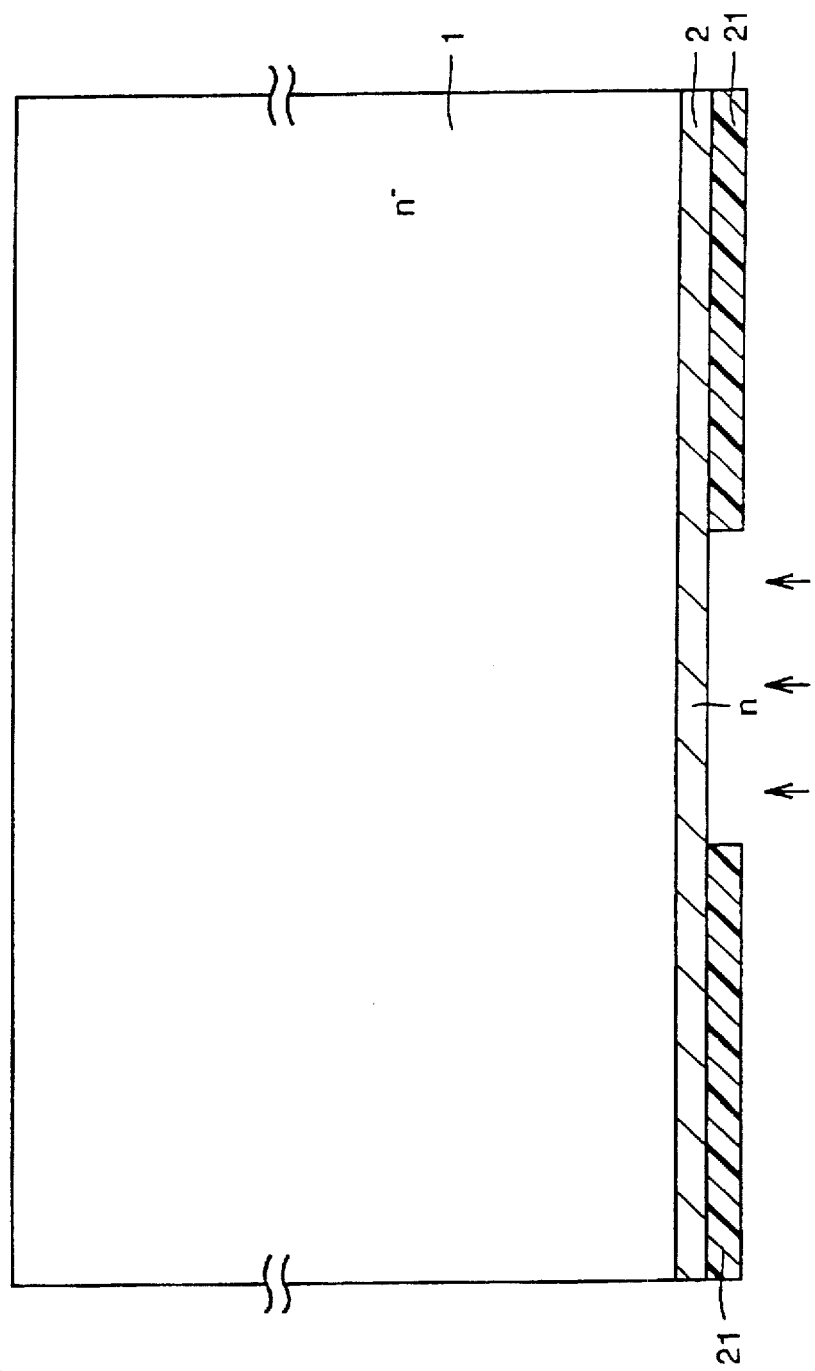
Figure 18:
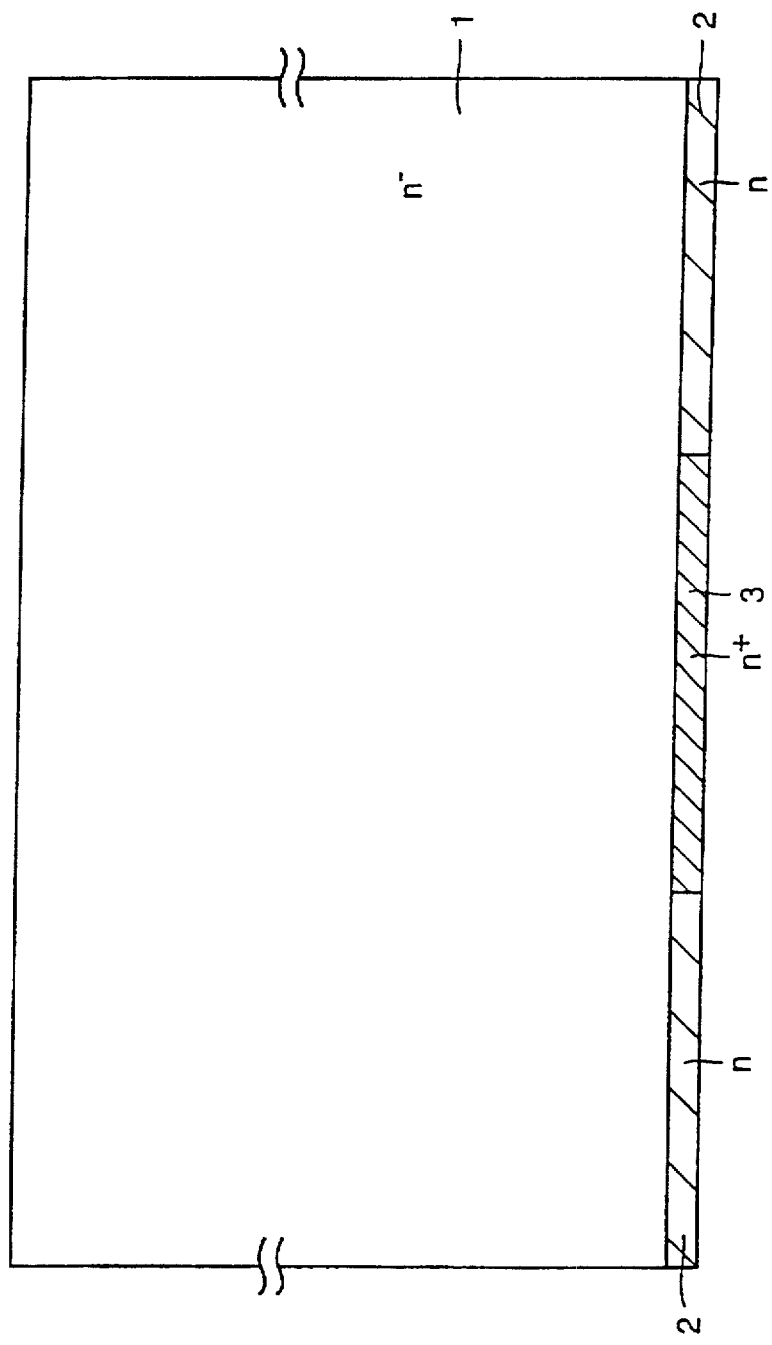

Referring to FIG. 17, a resist film 21 having a predetermined opening is formed at the second main surface by a photolithography technique. n-type impurity such as phosphorus having a large diffusion coefficient is implanted into n-type buffer layer 2 with a dose in a range from the dose for n-type buffer layer 2 to $5 \times 10^{16}$ cm⁻² and an implantation energy of 100 keV or less. Thereafter, resist film 21 is removed as shown in FIG. 18.

Figure 19:
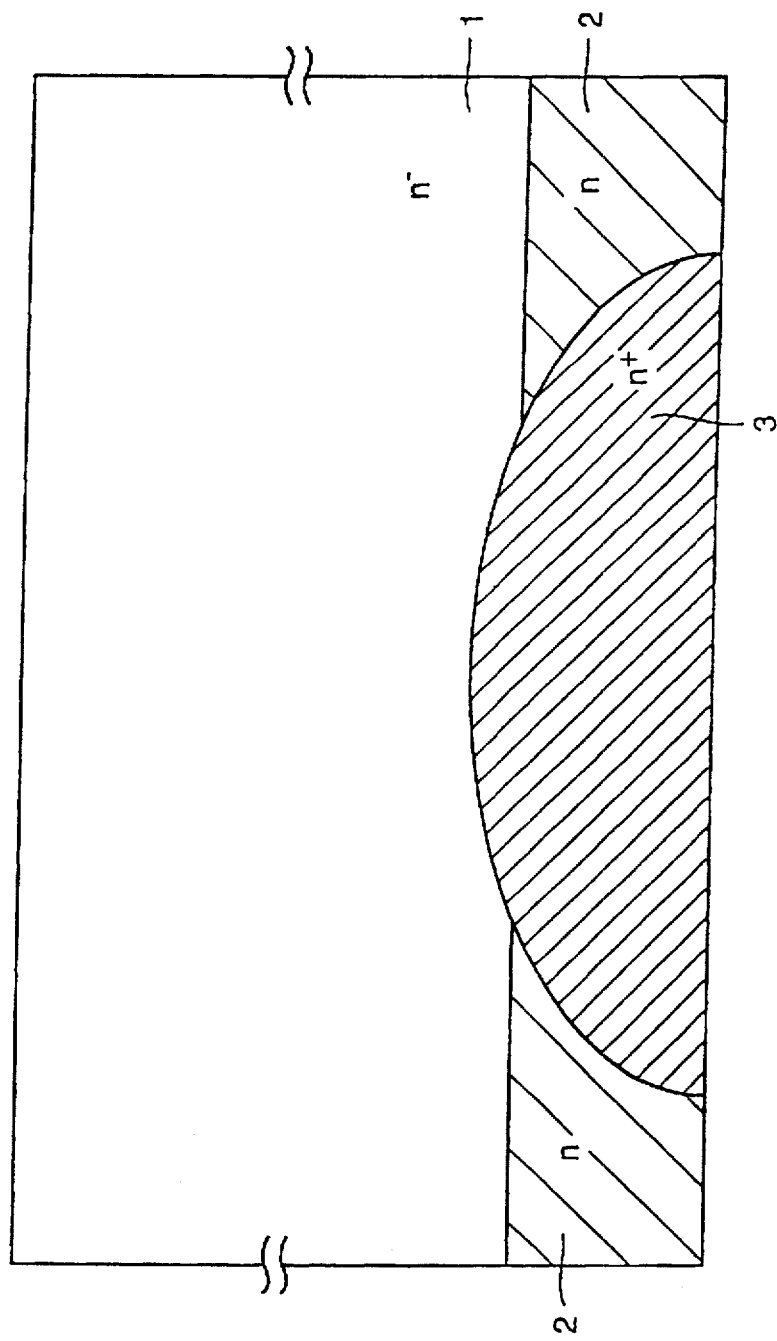

A heat treatment for diffusing impurity is effected on the substrate at a high temperature from 1200° C. to 1250° C. for 20 to 30 hours, so that n⁺-type layer 3 is formed on n-type buffer layer 2 as shown in FIG. 19.

Figure 20:
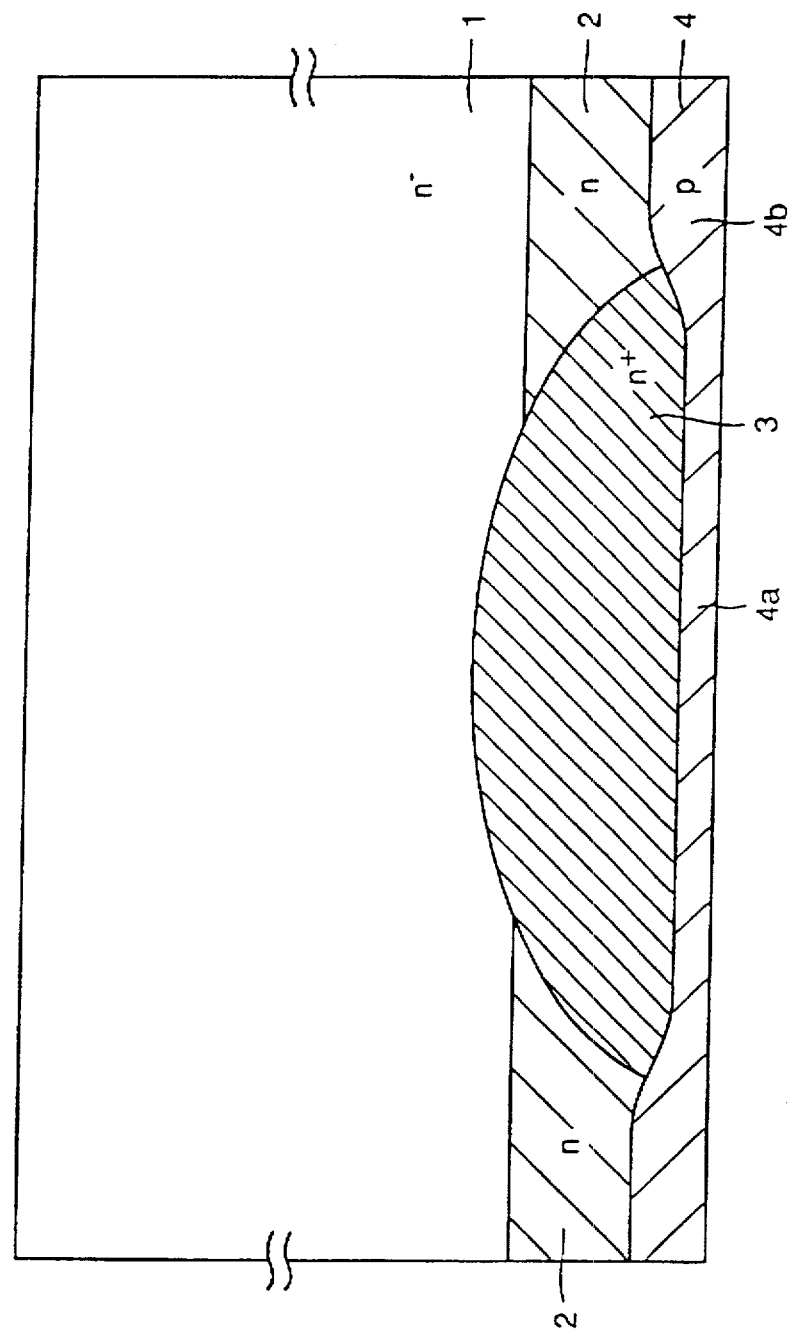

As shown in FIG. 20, p-type impurity such as boron or gallium is implanted into the whole second main surface with a dose in a range from that for n⁺-type layer 3 to $5 \times 10^{16}$ cm⁻² and an implantation energy of 100 keV or less. Thereafter, a heat treatment is performed at a high temperature from 1100° C. to 1200° C. for one to five hours, so that p-type collector layer 4 is formed. By the heat treatments described above, n-type buffer layer 2, n⁺-type layer 3 and p-type collector layer 4 having profiles shown in FIGS. 14 and 15 are formed.

Thereafter, steps using known techniques are performed to form collector electrode 5 at the second main surface side as well as gate trenches and others at the first main surface side, so that the IGBT of the embodiment 2 shown in FIG. 13 is completed.

Similarly to the IGBT of the embodiment 1, the structure of IGBT of the embodiment 2 can suppress introduction of holes from p-type collector layer 4 into n⁺-type layer 3 at first region 4a, and does not suppress introduction of holes from p-type collector layer 4 into n-type buffer layer 2 at second region 4b.

It is assumed that a ratio of a lateral (X) diffusion depth of n⁺-type layer 3 to a longitudinal (Y) diffusion depth of the same is about 0.8. When the diffusion depth of n⁺-type layer 3 into the substrate is 40 μm, the lateral diffusion depth or length is about 32 μm. It can be understood that introduction of holes can be controlled when the repetition pitch is about 60 μm or more. Therefore, the on-voltage can be controlled.

Therefore, the pitch of short portions in the embodiment 2 can be reduced to about three-fifths of that in the conventional short collector structure.

Similarly to the embodiment 1, the embodiment 2 can improve uniformity in operation characteristics of semiconductor devices owing to the fact that the repetition pitch can be reduced in a device having a short pitch of repetition of, e.g., trench gate IGBTs at the surface.

Embodiment 3

A semiconductor device and a method of manufacturing the same of the embodiment 3 of the invention will be described below with reference to FIGS. 21 to 29.

The semiconductor device of the embodiment 3 has a structure similar to that of the IGBT of the embodiment 1 already described. Portions and parts having the same function bear the same reference numbers.

Figure 21:
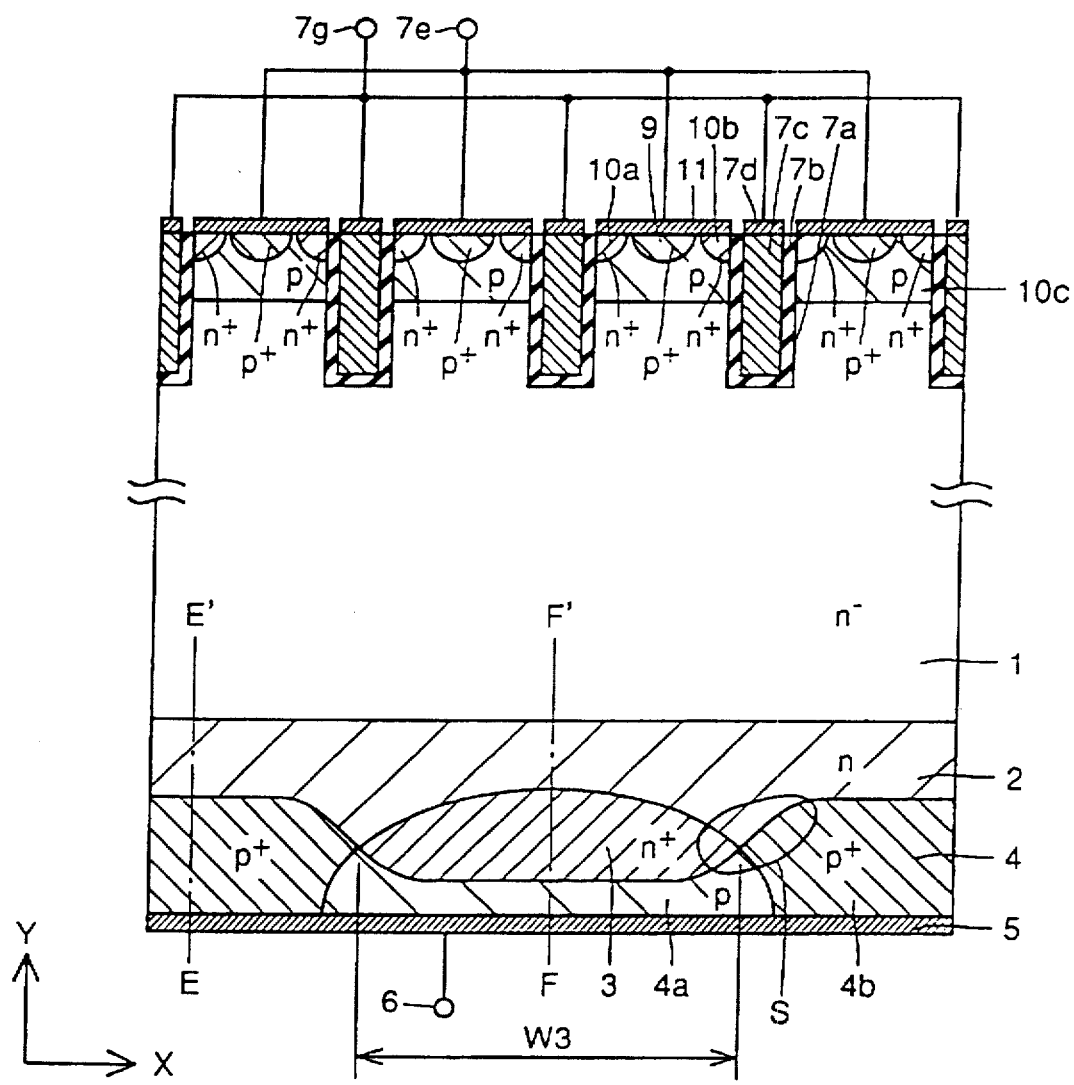
FIG. 21 is a cross section showing a structure of an IGBT according to an embodiment 3 of the invention.
Figure 22:
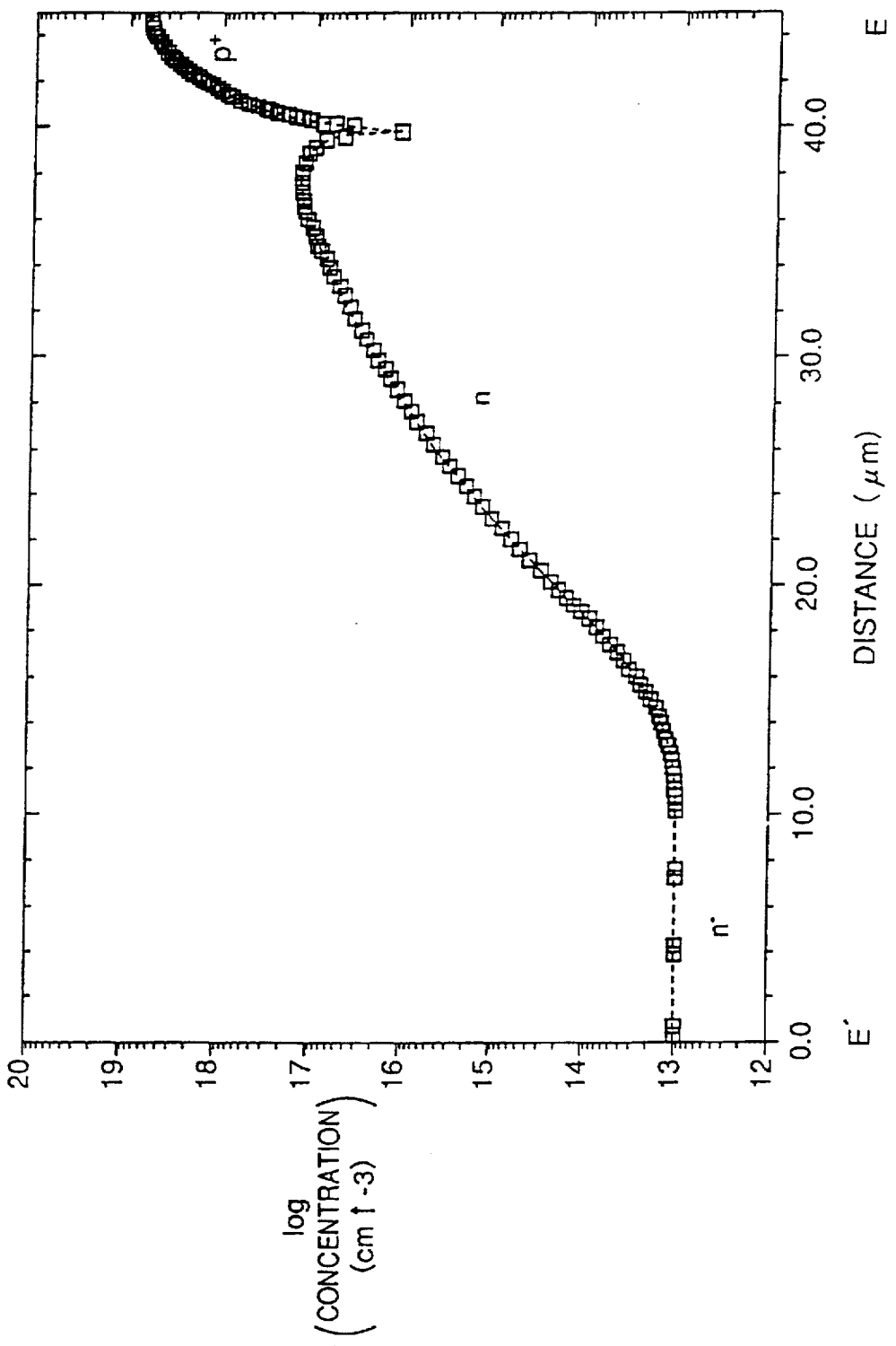
FIG. 22 shows a profile of impurity taken along line E'-E in FIG. 21.
Figure 23:
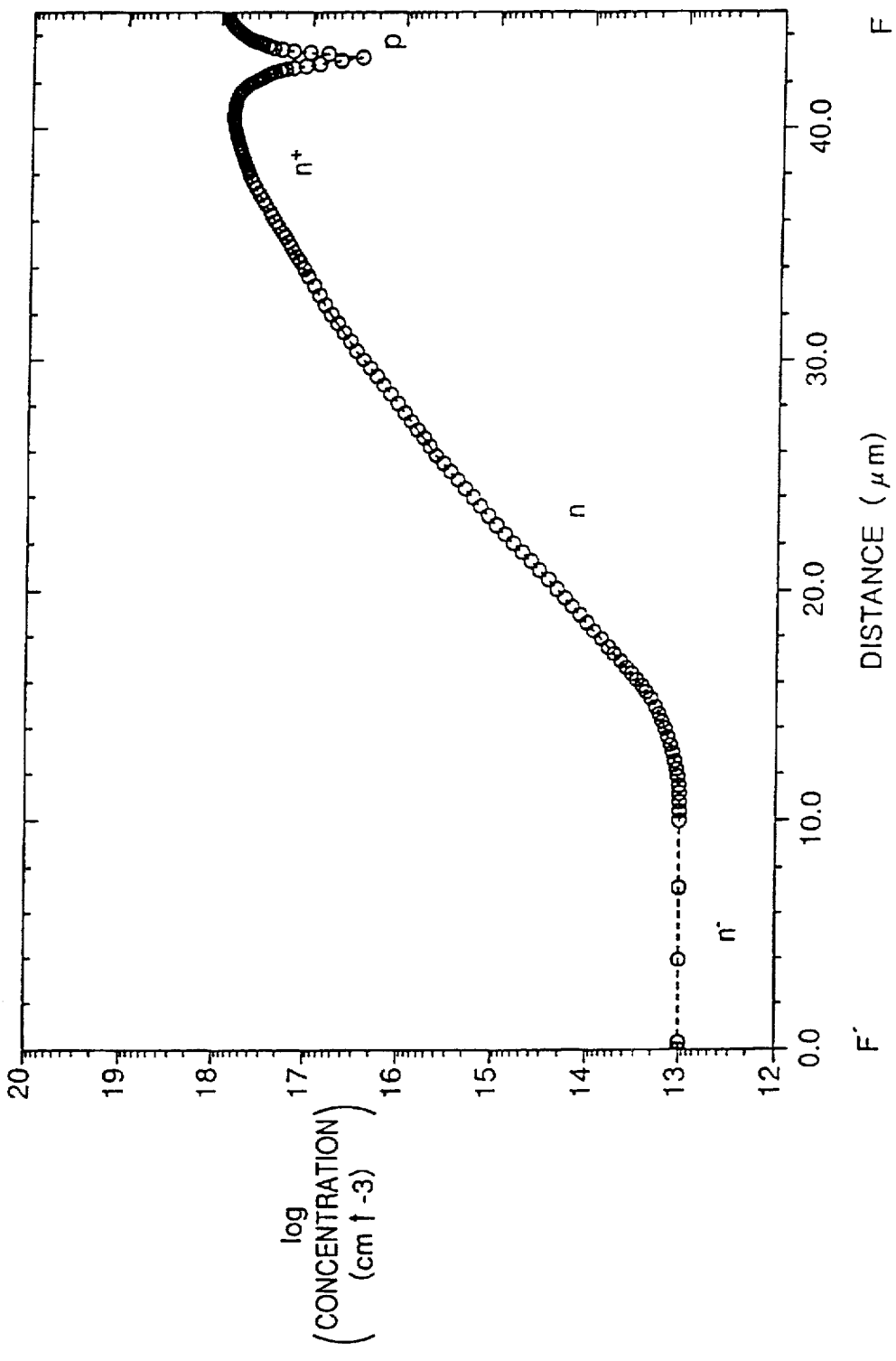
FIG. 23 shows a profile of impurity taken along line F'-F in FIG. 21.

Referring to FIG. 21, the IGBT of the embodiment 3 differs from that of the embodiment 1 in that second region 4b in p-type collector layer 4 is doped more heavily than first region 4a, and a diffusion depth of impurity toward the first main surface is further increased. Impurity profiles taken along lines E'-E and F'-F in FIG. 21 are shown in FIGS. 22 and 23, respectively.

A method of manufacturing the IGBT of the embodiment 3 having the above structure will be described below with reference to FIGS. 24 to 29.

Figure 24:
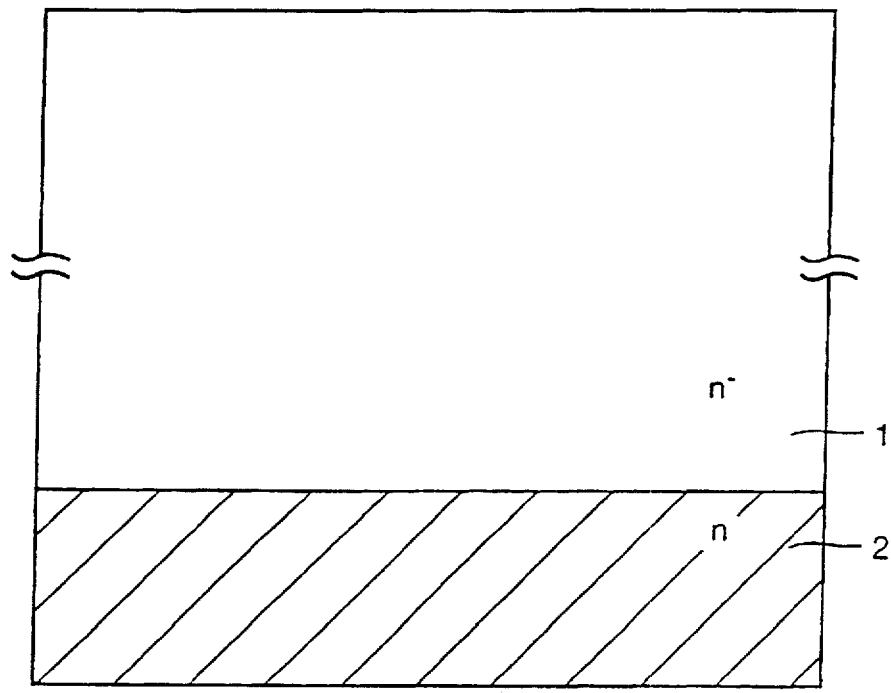
FIGS. 24 to 29 are cross sections showing 1st to 6th steps in a process of manufacturing the IGBT of the embodiment 3 of the invention, respectively.

Referring first to FIG. 24, n-type impurity such as phosphorus ions having a large diffusion coefficient is implanted with a dose from $5 \times 10^{13}$ to $5 \times 10^{16}$ cm$^{-2}$ and an implantation energy of 100 keV or less into the second main surface of n$^-$-type layer 1 which is made of an n$^-$ silicon substrate having an impurity concentration of $1 \times 10^{13}$ cm$^{-3}$ or less. Thereafter, a heat treatment is performed at a high temperature from 1200° C. to 1250° C. for 20 to 30 hours, so that n-type buffer layer 2 is formed. The n-type buffer layer may be formed by another method such as a method using epitaxial growth and forming the layer by ion implantation, or a method of forming a silicon crystal layer having a similar concentration of n-type impurity.

Figure 25:
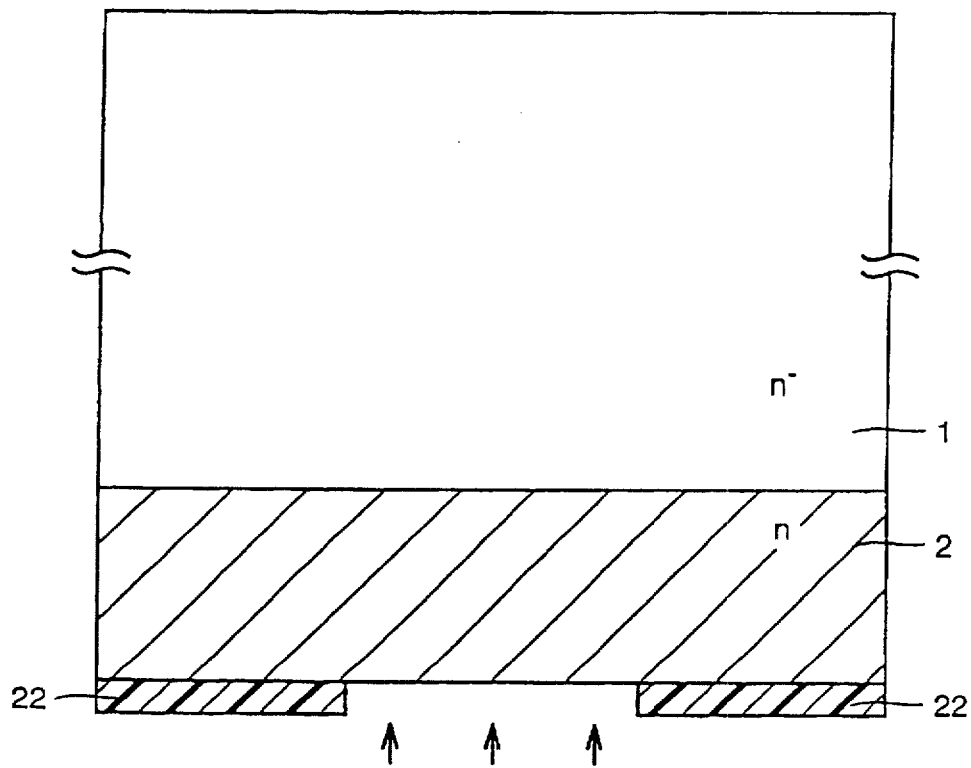
Figure 26:
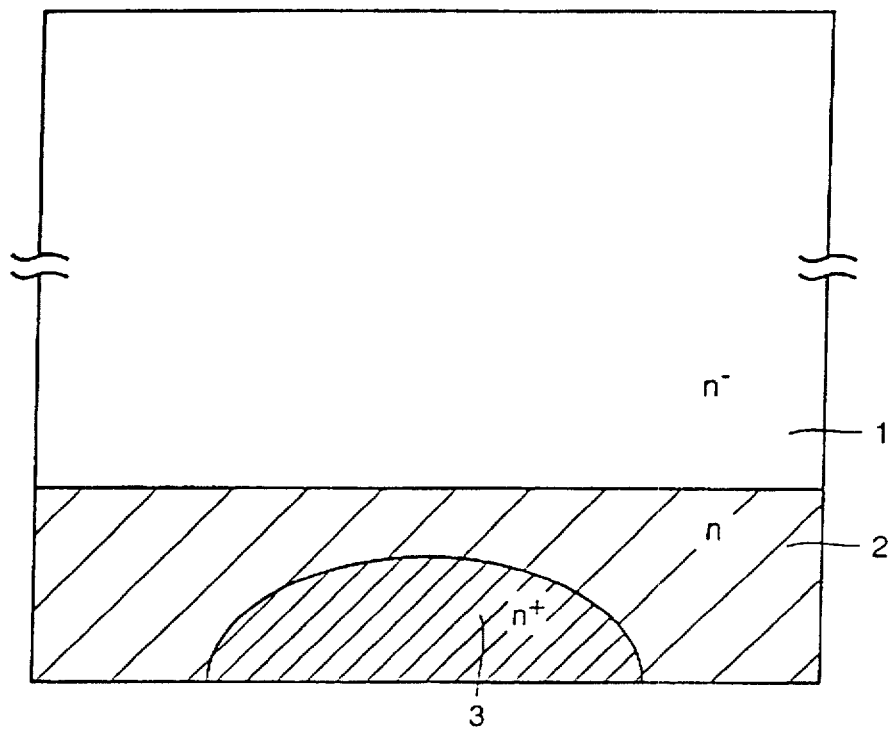

Referring to FIG. 25, a resist film 22 having a predetermined opening is formed at the second main surface by a photolithography technique. n-type impurity such as phosphorus ions having a large diffusion coefficient is implanted into n-type buffer layer 2 with a dose in a range from that for n-type buffer layer 2 to $5 \times 10^{16}$ cm$^{-2}$ and an implantation energy of 100 keV or less. Thereafter, a heat treatment is performed at a high temperature from 1200° C. to 1250° C. for 1 to 10 hours after removing resist film 22 as shown in FIG. 26, so that n$^+$-type layer 3 is formed.

Figure 27:
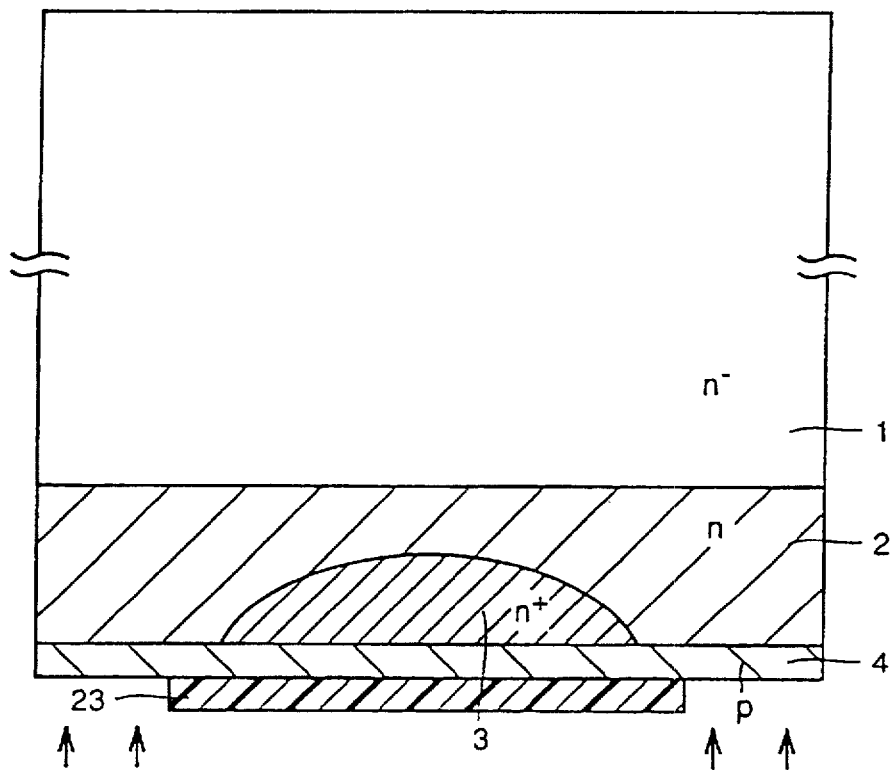

As shown in FIG. 27, p-type impurity such as boron is implanted into the whole second main surface with a dose in a range from that for n$^+$-type layer 3 to $5 \times 10^{16}$ cm$^{-2}$ and an implantation energy of 100 keV or less, so that p-type collector layer 4 is formed.

Figure 28:
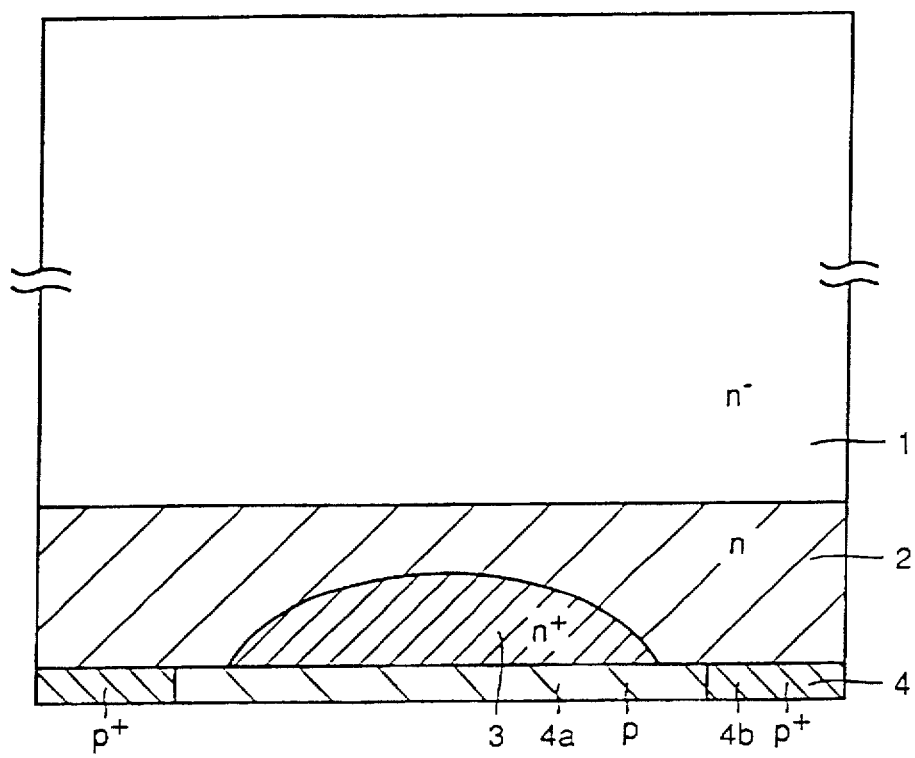

A resist film 23 covering n$^+$-type layer 3 is formed by a lithography technique, and p-type impurity such as boron is implanted into the p-type collector layer 4 masked by resist film 23 with a dose in a range from that for n$^+$-type layer 3 to $5 \times 10^{16}$ cm$^{-2}$ and an implantation energy of 100 keV or less, so that second region 4b having an impurity concentration higher than that of first impurity region 4a are formed at p-type collector layer 4 as shown in FIG. 28.

Figure 29:
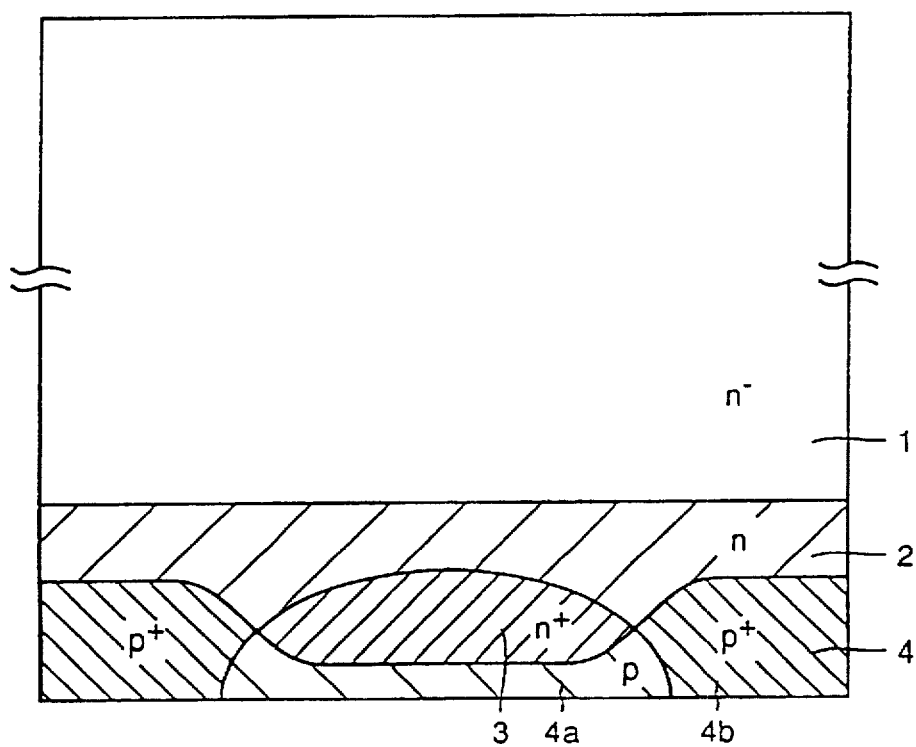

Thereafter, a heat treatment is effected on the substrate at a high temperature from 1100° C. to 1200° C. for one to five hours, so that p-type collector layer 4 is formed as shown in FIG. 29. Through the steps described above, profiles of impurity shown in FIGS. 22 and 23 are completed.

Thereafter, steps using known techniques are performed to form collector electrode 5 at the second main surface side as well as gate trenches and others at the first main surface side, so that the IGBT of the embodiment 3 shown in FIG. 21 is completed.

The IGBT of the embodiment 3 can achieve an operation and an effect similar to those of the embodiment 2. It is assumed that a ratio of a lateral diffusion depth of n$^+$type layer 3 to a longitudinal diffusion depth of the same is about 0.8. When the diffusion depth of n$^+$-type layer 3 into n$^-$-type layer 1 is 10 μm, the lateral diffusion depth or length is about 8 μm. It can be understood that introduction of holes can be controlled when the repetition pitch is about 20 μm or more.

Therefore, it is apparent that the embodiment 3 can reduce the repetition pitch of n$^+$-type layers 3 to about one-fifth of the required repetition pitch of the short portions in the conventional short collector structure, which is about 100 μm.

In a device such as a trench gate IGBT having a short repetition pitch of bipolar elements at the first main surface side, the n$^+$-type layers in this embodiment which can reduce the repetition pitch is preferable for uniformizing characteristics of semiconductor devices, similarly to the embodiment 1.

In the IGBT of the embodiment 3, a region of n$^+$-type layer 3 near p-type collector layer 4 defined by S in FIG. 1 cannot be designed freely to have an intended configuration. This is because p-type collector layer 4 is formed at the step shown in FIG. 12 by uniformly implanting p-type impurity into the whole substrate surface without using a mask, so that the pn junction surface is formed by p-type collector layer 4 and n$^+$-type layer 3, which is already formed in the substrate, without being particularly restricted.

Meanwhile, first region 4a in the embodiment 3 is formed using a mask as shown in FIG. 27, so that a region of n$^+$-type layer 3 near p-type collector layer 4 defined by S in FIG. 1 can be designed freely to have an intended configuration. Consequently, a width (W$_3$) of n$^+$-type layer 3 can be freely determined when forming n$^+$-type layer 3, so that the on-voltage can be controlled more finely.

Embodiment 4

A semiconductor device and a method of manufacturing the same of the embodiment 4 of the invention will be described below with reference to FIGS. 30 to 40.

Figure 30:
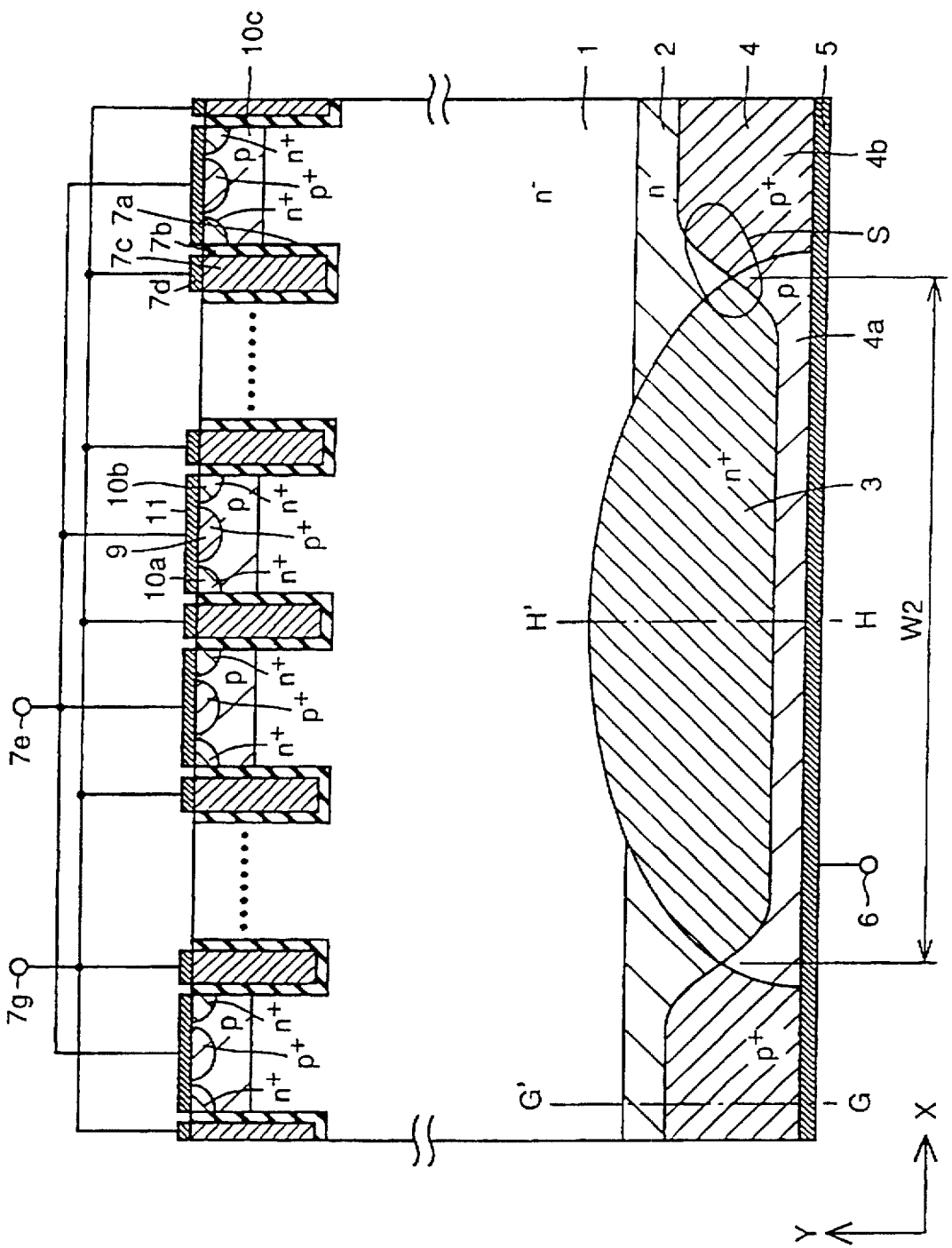
FIG. 30 is a cross section showing a structure of an IGBT according to an embodiment 4 of the invention.

Referring first to FIG. 30, a sectional structure of the semiconductor device of the embodiment 4 will be described below. The semiconductor device of the embodiment 4 differs from the IGBT of the embodiment 2 shown in FIG. 13 in that second region 4b in p-type collector layer 4 is doped more heavily than first region 4a, and a diffusion depth of impurity diffusing toward the first main surface is increased.

Figure 31:
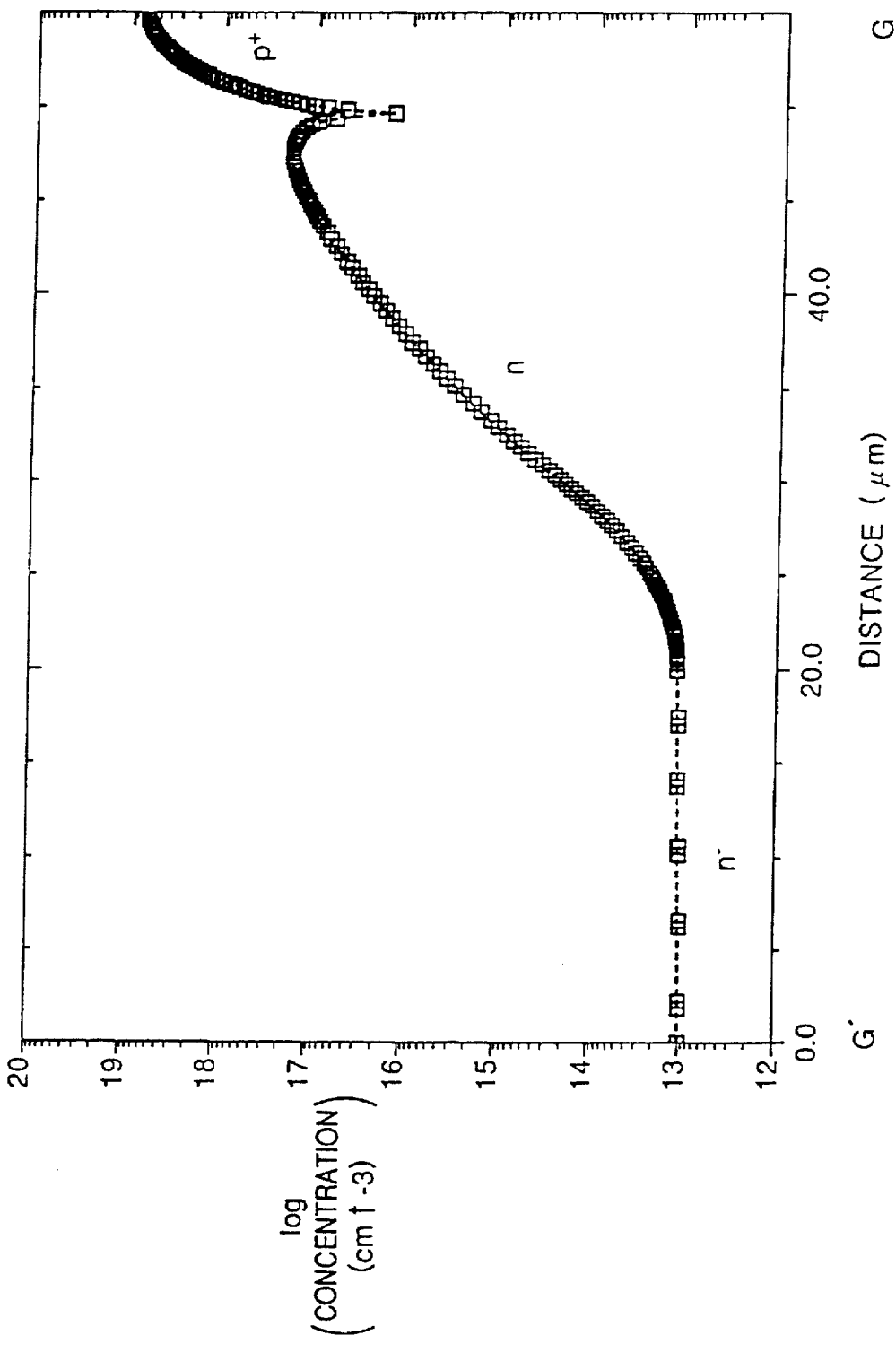
FIG. 31 shows a profile of impurity taken along line G'-G in FIG. 30.
Figure 32:
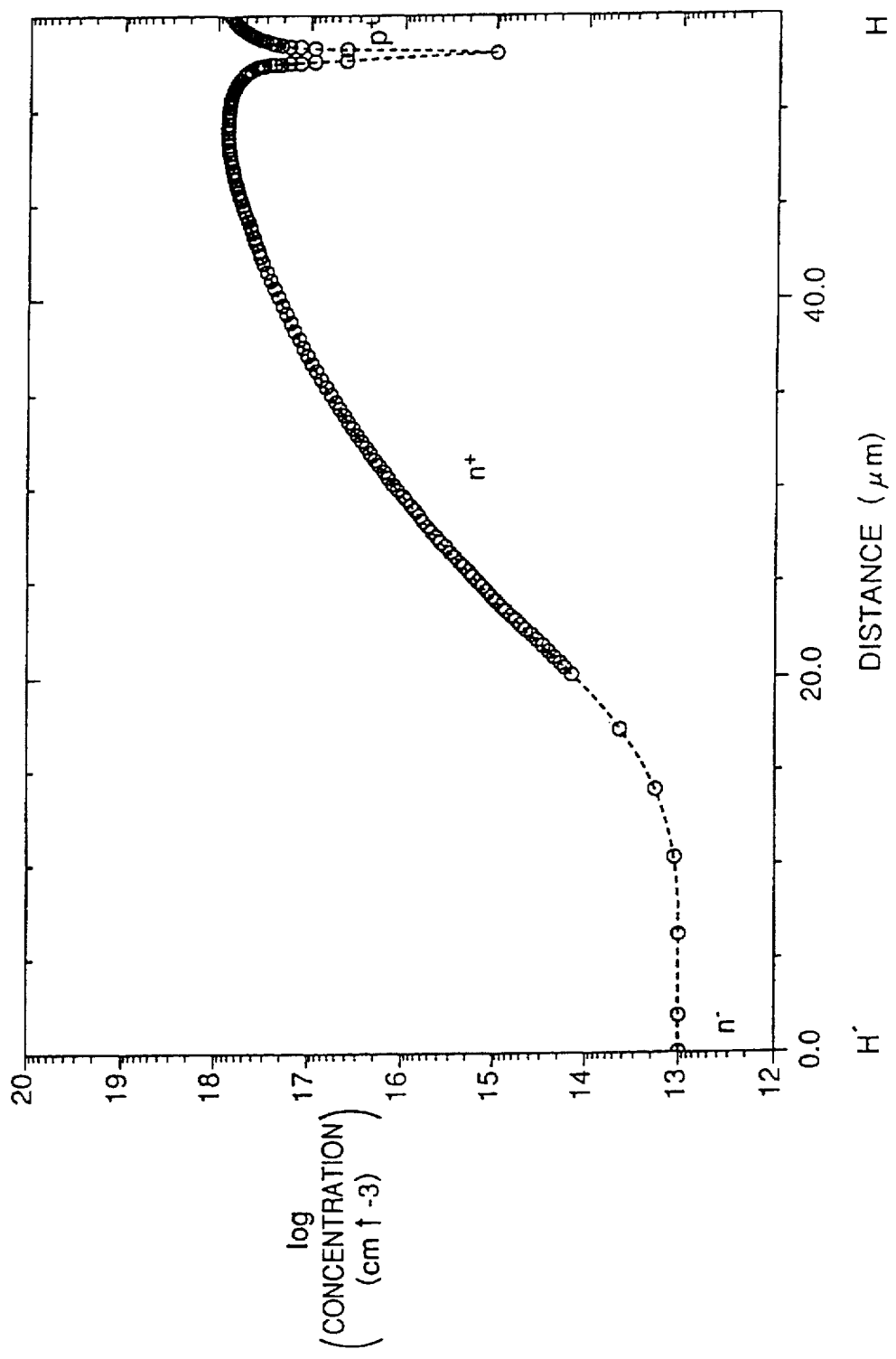
FIG. 32 shows a profile of impurity taken along line H'-H in FIG. 30.

Impurity profiles taken along lines G'-G and H'-H in FIG. 30 are shown in FIGS. 31 and 32, respectively.

A method of manufacturing the IGBT of the embodiment 4 having the above structure will be described below with reference to FIGS. 33 to 40.

Figure 33:
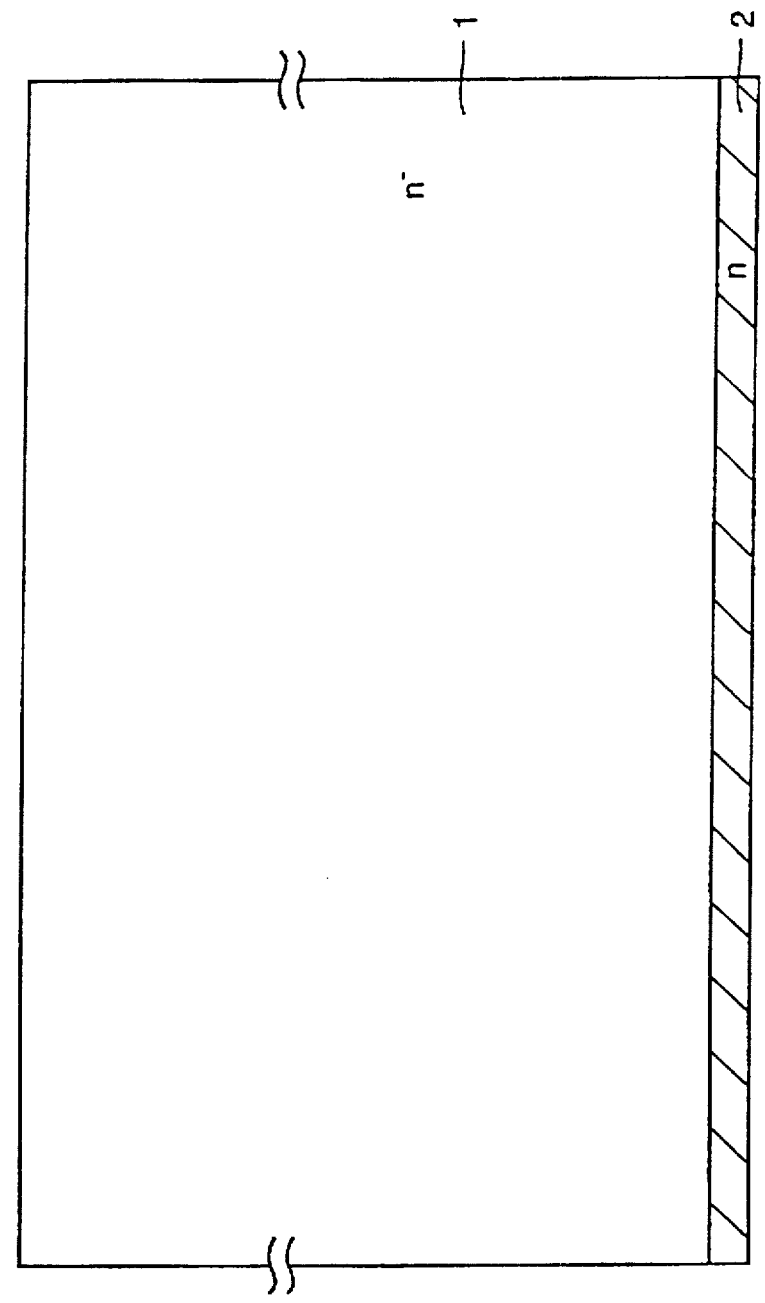
FIGS. 33 to 40 are cross sections showing 1st to 8th steps in a process of manufacturing the IGBT of the embodiment 4 of the invention, respectively.

Referring first to FIG. 33, n-type impurity such as phosphorus having a large diffusion coefficient is implanted with a dose from $5 \times 10^{13}$ to $5 \times 10^{16}$ cm$^{-2}$ and an implantation energy of 100 keV or less into the second main surface of n$^-$-type layer 1 which is made of an n$^-$ silicon substrate having an impurity concentration of $1 \times 10^{13}$ cm$^{-3}$ or less.

Figure 34:
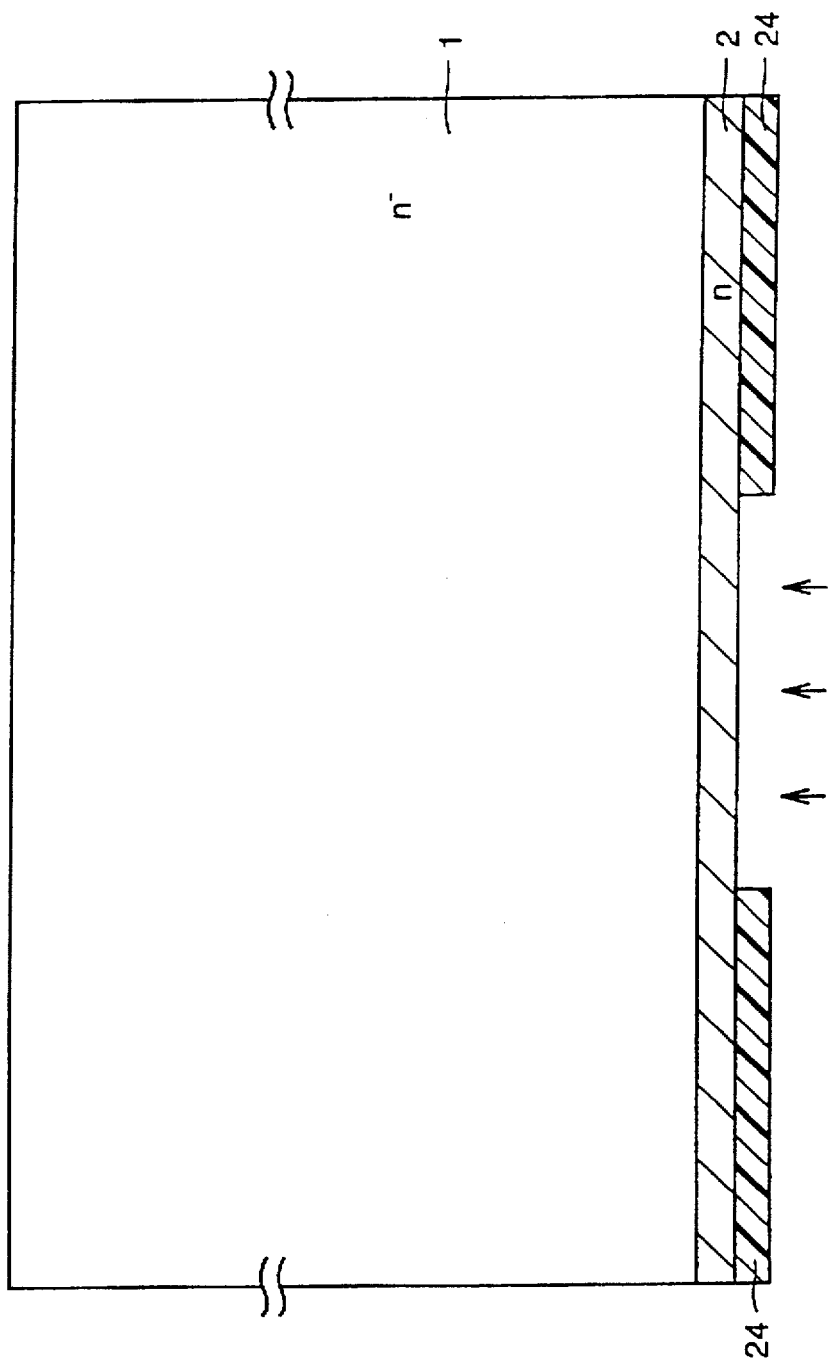
Figure 35:
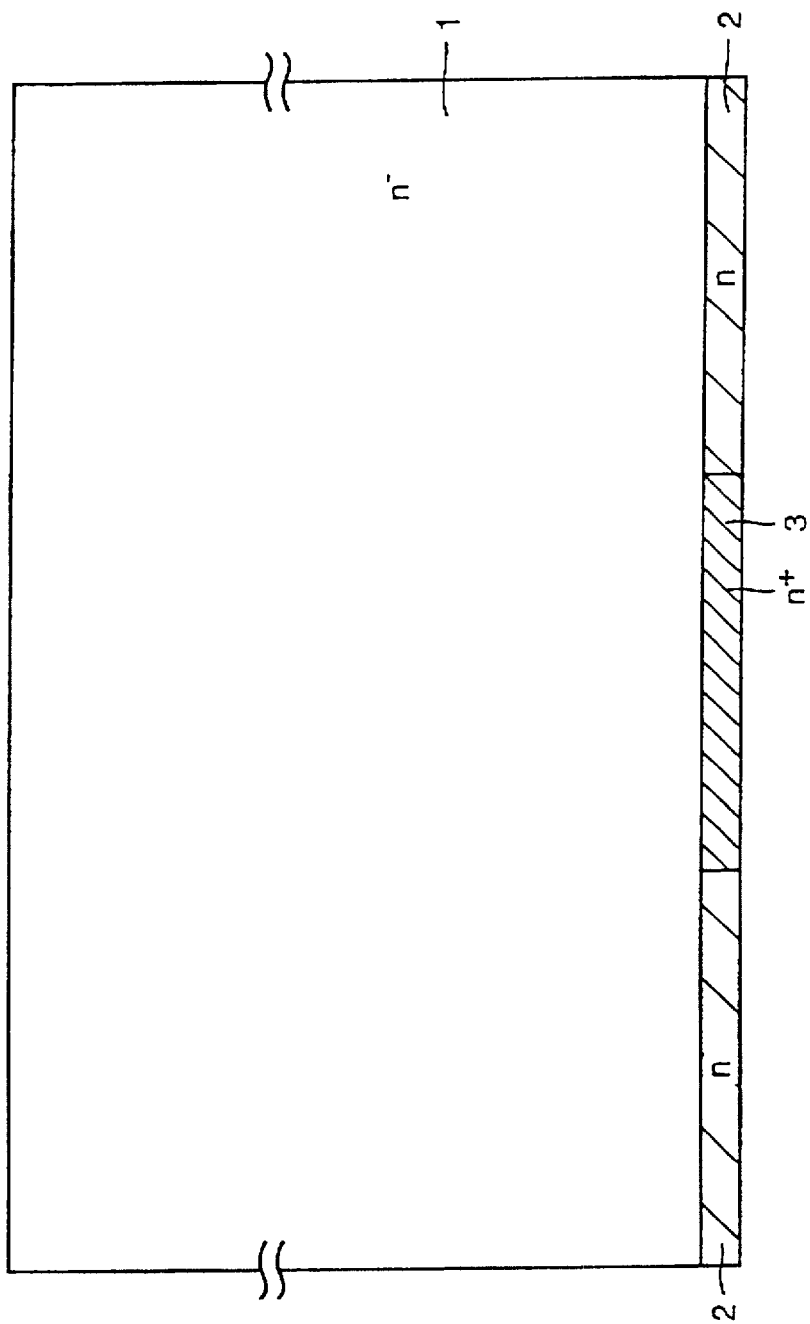

Referring to FIG. 34, a resist film 24 having a predetermined opening is formed at the surface of n-type buffer layer 2 by a photolithography technique. n-type impurity such as phosphorus having a large diffusion coefficient is implanted into n-type buffer layer 2 with a dose in a range from that for n-type buffer layer 2 to $5 \times 10^{16}$ cm$^{-2}$ and an implantation energy of 100 keV or less, so that n$^+$-type layer 3 is formed as shown in FIG. 35. Thereafter, a resist film 24 is removed.

Figure 36:
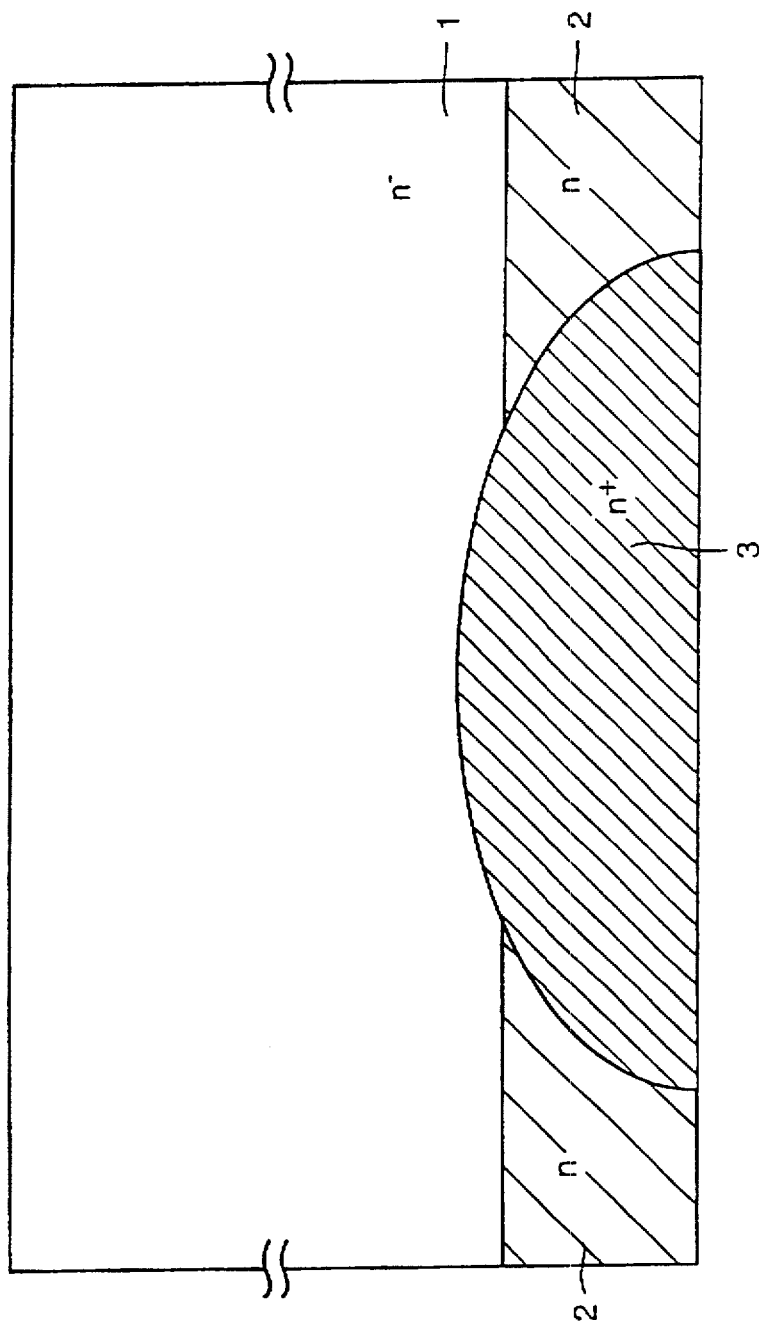

Referring to FIG. 36, a heat treatment is effected on the substrate at a high temperature from 1200° C. to 1250° C. for 20 to 30 hours, so that n-type buffer layer 2 and n$^+$-type layer 3 are completed.

Figure 37:
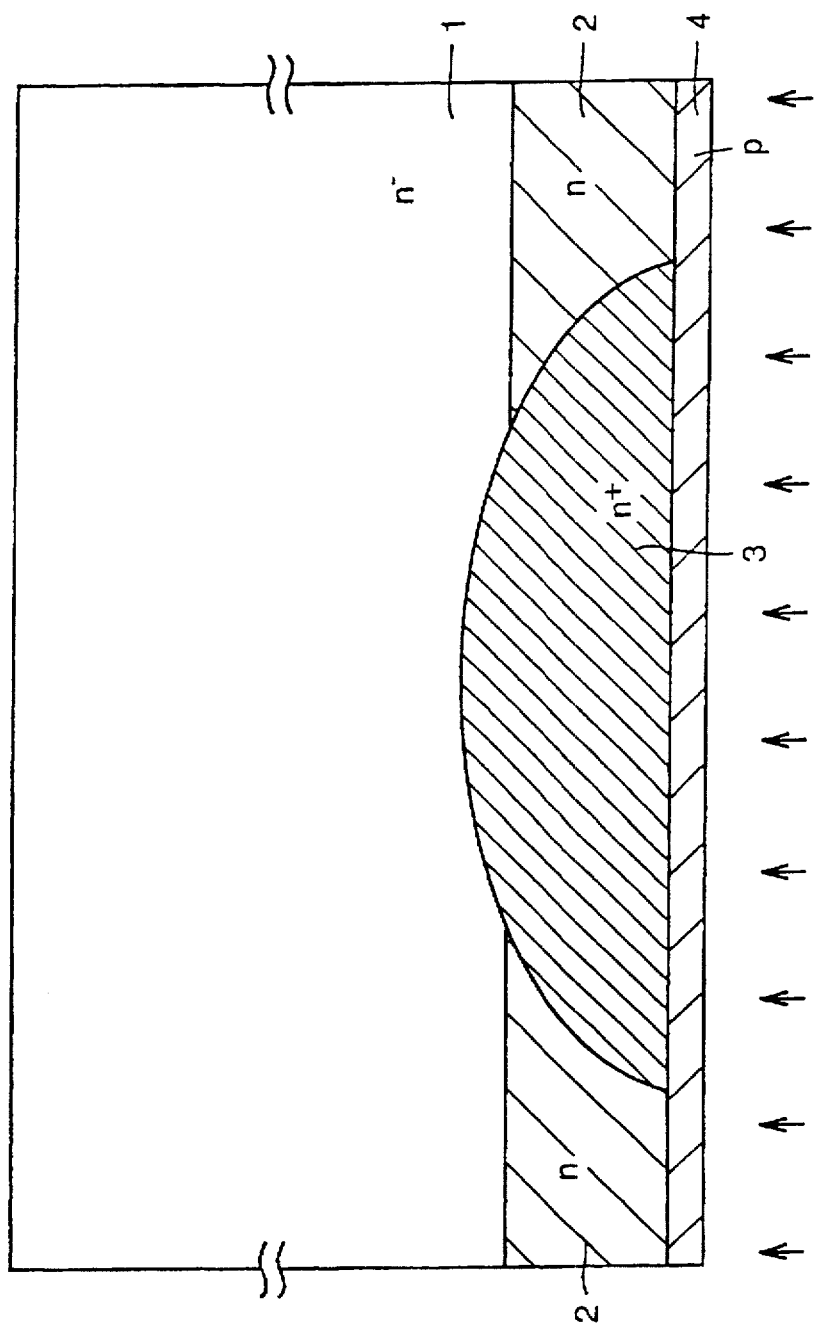
Figure 38:
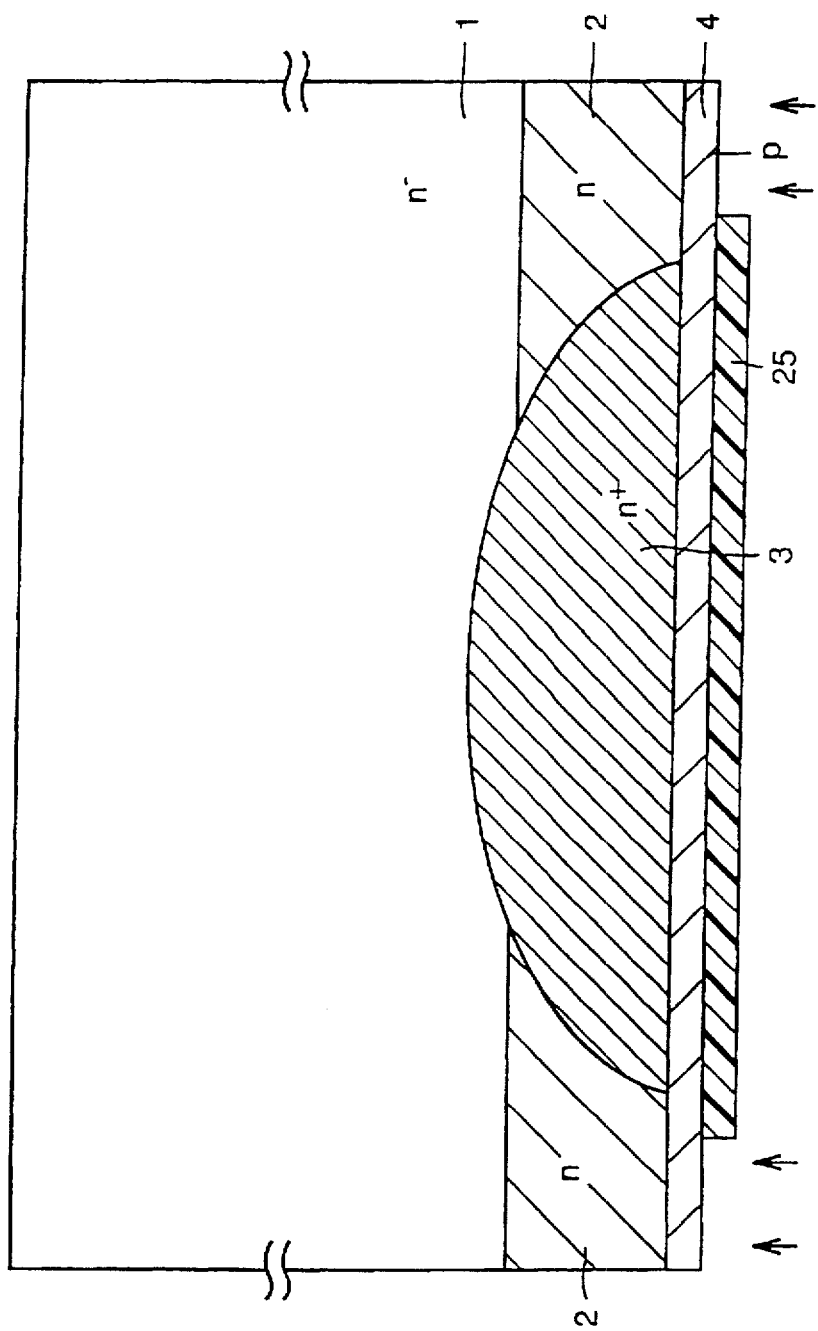
Figure 39:
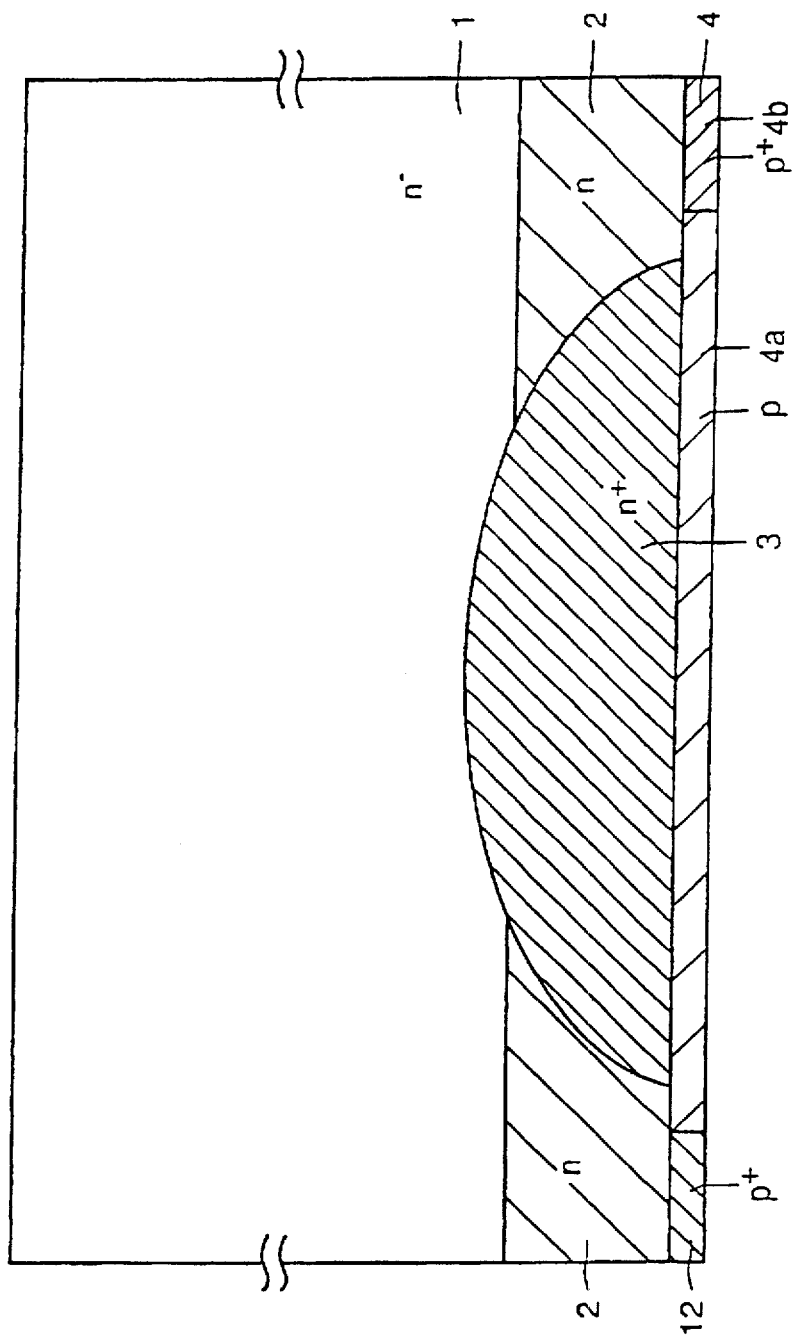
Figure 40:
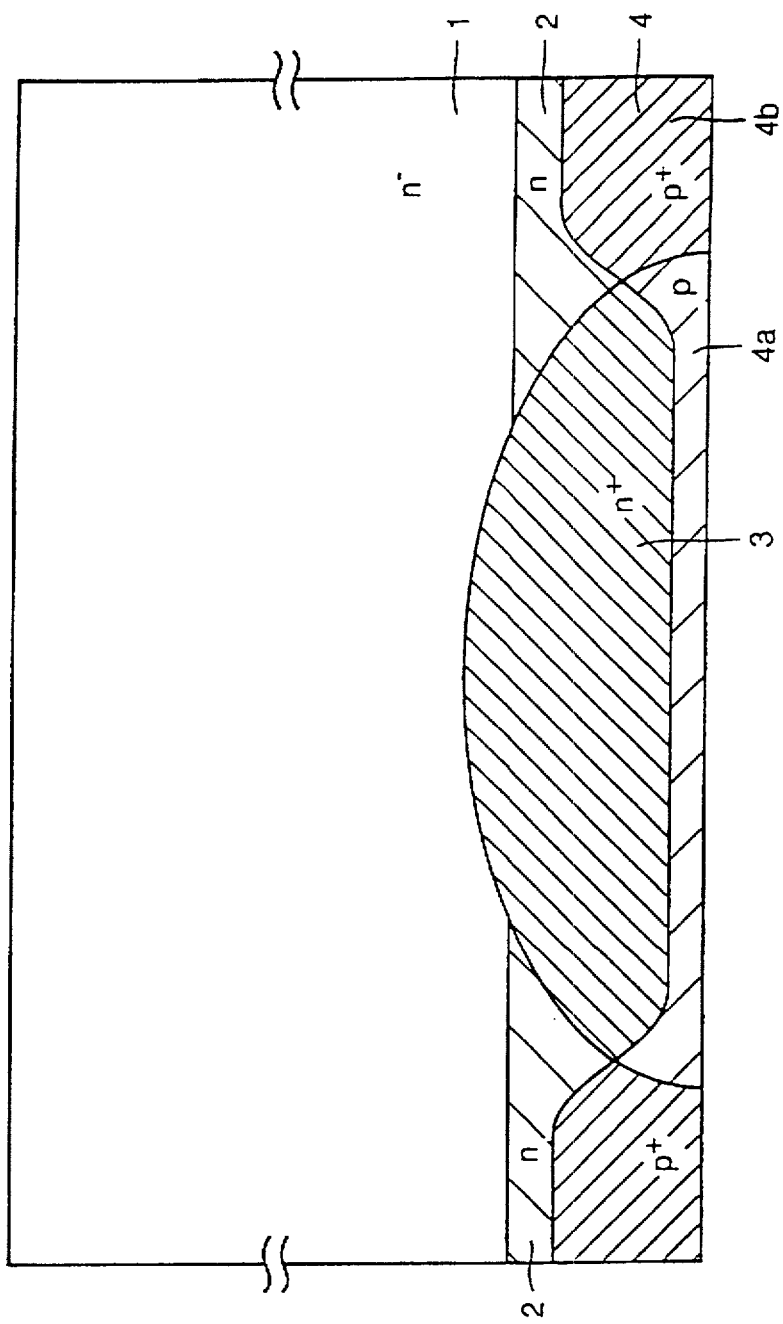

As shown in FIG. 37, p-type impurity such as boron is implanted into the whole second main surface with a dose in a range from that for the n⁺-type layer to $5 \times 10^{16}$ cm⁻² and an implantation energy of 100 keV or less, so that p-type collector layer 4 is formed.

A resist film 25 covering n⁺-type layer 3 is formed by a lithography technique, and p-type impurity such as boron is implanted into the p-type collector layer 4 masked by resist film 25 with a dose in a range from that for the p-type collector layer to $5 \times 10^{16}$ cm⁻² and an implantation energy of 100 keV or less, so that second region 4b having a high impurity concentration and first region 4a having a ordinary impurity concentration are formed at p-type collector layer 4.

Thereafter, a heat treatment is effected on the substrate at a high temperature from 1100° C. to 1200° C. for one to five hours, so that p-type collector layer 4 is completed. Through the steps described above, profiles of impurity shown in FIGS. 31 and 32 are completed.

Similarly to the IGBT of the embodiment 2, the structure of IGBT of the embodiment 4 can suppress introduction of holes from p-type collector layer 4 into n⁺-type layer 3 at first region 4a, and does not suppress introduction of holes from p-type collector layer 4 into n-type buffer layer 2 at second region 4b. It is assumed that a ratio of a lateral (X) diffusion depth of n⁺-type layer 3 to a longitudinal (Y) diffusion depth of the same is about 0.8. When the diffusion depth of n⁺-type layer 3 into the substrate is 40 μm, the lateral diffusion depth or length is about 32 μm. It can be understood that introduction of holes can be controlled when the repetition pitch is about 60 μm or more. Therefore, the on-voltage can be controlled.

Therefore, it is apparent that the embodiment 4 can reduce the pitch of short portions to about three-fifths of that in the conventional short collector structure, similarly to the embodiment 2.

The embodiment 4 can improve uniformity in operation characteristics of semiconductor devices owing to the fact that the repetition pitch can be reduced in a device having a short pitch of repetition of, e.g., trench gate IGBTs at the surface.

In the IGBT of the embodiment 2 shown in FIG. 13, a region of n⁺-type layer 3 near p-type collector layer 4 defined by S in FIG. 1 cannot be designed freely to have an intended configuration. This is because p-type collector layer 4 is formed at the step shown in FIG. 20 by uniformly implanting impurity into the whole substrate surface without using a mask, so that a pn junction surface is formed by p-type collector layer 4 and n⁺-type layer 3, which is already formed in the substrate, without being particularly restricted.

Meanwhile, first region 4a in the embodiment 4 is formed using a mask as shown in FIG. 33, so that a region of n⁺-type layer 3 near p-type collector layer 4 defined by S in FIG. 30 can be designed freely to have an intended configuration. Consequently, a width ($W_3$) of n⁺-type layer 3 can be freely determined when forming n⁺-type layer 3, so that the on-voltage can be controlled more finely.

According to the semiconductor device and the method of manufacturing the same of the invention, the second semiconductor layer, which is of the same conductivity type as the first semiconductor layer and has the impurity concentration higher than the first semiconductor layer, is formed at a region between the first and third semiconductor layers.

As a result, introduction of holes is not suppressed at a region where the third and first semiconductor layers are in contact, and introduction of holes can be suppressed at a region including the second semiconductor layer interposed between them, so that the turn-off loss which is a power loss at turn-off can be reduced.

In the conventional collector short structure, an extremely large spacing of about hundreds of micrometers is required between the short portions in order to set the resistance of the region to a practical value, so that ununiformity occurs in characteristics of semiconductor devices in a common chip. However, according to the structure of the invention, the pitch of semiconductor layers can be reduced to one-fifth of the required distance between the short portions, so that uniformity can be achieved in the characteristics of semiconductor devices in a common chip.

Since the third semiconductor layer can be formed easily by a conventional technique, i.e., introduction of impurity, no problem arises in the manufacturing steps.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device operable to flow a main current between first and second main surfaces of a semiconductor substrate of an intrinsic or first conductivity type, comprising:

a first semiconductor layer of the first conductivity type formed at a second main surface side and having an impurity concentration higher than that of said semiconductor substrate;

a second semiconductor layer of the first conductivity type formed at a partial region of said first semiconductor layer and having an impurity concentration higher than that of said first semiconductor layer; and a third semiconductor layer of a second conductivity type opposite to said first conductivity type covering said first and second semiconductor layers, wherein for suppressing introduction of holes from said third semiconductor layer into said second semiconductor layer without suppressing introduction of holes from said third semiconductor layer into said first semiconductor layer, a diffusion depth of impurity diffused in said third semiconductor layer toward said first main surface is determined such that the diffusion depth at a first region opposed to said second semiconductor layer is smaller than that at a second region opposed to said first semiconductor layer, wherein the said first region in said third semiconductor layer has a lower impurity concentration than said second region.

* * * * *